(12) United States Patent
Perera et al.

(10) Patent No.: US 9,252,246 B2
(45) Date of Patent: Feb. 2, 2016

(54) INTEGRATED SPLIT GATE NON-VOLATILE MEMORY CELL AND LOGIC DEVICE

(71) Applicants: Asanga H. Perera, West Lake Hills, TX (US); Cheong Min Hong, Austin, TX (US); Sung-Taeg Kang, Austin, TX (US); Jane A. Yater, Austin, TX (US)

(72) Inventors: Asanga H. Perera, West Lake Hills, TX (US); Cheong Min Hong, Austin, TX (US); Sung-Taeg Kang, Austin, TX (US); Jane A. Yater, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 4 days.

(21) Appl. No.: 13/972,372

(22) Filed: Aug. 21, 2013

(65) Prior Publication Data

US 2015/0054050 A1 Feb. 26, 2015

(51) Int. Cl.
| | |
|---|---|
| *H01L 21/336* | (2006.01) |
| *H01L 29/66* | (2006.01) |
| *H01L 21/28* | (2006.01) |
| *H01L 29/423* | (2006.01) |
| *H01L 27/115* | (2006.01) |

(52) U.S. Cl.
CPC .... *H01L 29/66825* (2013.01); *H01L 21/28273* (2013.01); *H01L 27/11534* (2013.01); *H01L 29/42332* (2013.01)

(58) Field of Classification Search
CPC .................. H01L 27/11517; H01L 27/11534; H01L 29/42332
USPC .................. 257/325, 326; 438/267, 287, 288
See application file for complete search history.

(56) References Cited

U.S. PATENT DOCUMENTS

| | | | |
|---|---|---|---|
| 5,614,746 A | 3/1997 | Hong et al. | |
| 6,087,225 A | 7/2000 | Bronner et al. | |
| 6,130,168 A * | 10/2000 | Chu et al. ...................... | 438/717 |
| 6,194,301 B1 | 2/2001 | Radens et al. | |
| 6,235,574 B1 | 5/2001 | Tobben et al. | |
| 6,333,223 B1 | 12/2001 | Moriwaki et al. | |
| 6,388,294 B1 | 5/2002 | Radens et al. | |
| 6,509,225 B2 | 1/2003 | Moriwaki et al. | |
| 6,531,734 B1 | 3/2003 | Wu | |
| 6,635,526 B1 | 10/2003 | Malik et al. | |
| 6,707,079 B2 | 3/2004 | Satoh et al. | |
| 6,777,761 B2 | 8/2004 | Clevenger et al. | |
| 6,785,165 B2 | 8/2004 | Kawahara et al. | |
| 6,861,698 B2 | 3/2005 | Wang | |
| 6,939,767 B2 | 9/2005 | Hoefler et al. | |
| 7,154,779 B2 | 12/2006 | Mokhlesi et al. | |
| 7,183,159 B2 | 2/2007 | Rao et al. | |
| 7,190,022 B2 | 3/2007 | Shum et al. | |

(Continued)

FOREIGN PATENT DOCUMENTS

WO 2009058486 5/2009

OTHER PUBLICATIONS

Office Action mailed Nov. 22, 2013 in U.S. Appl. No. 13/780,591.

(Continued)

*Primary Examiner* — Earl Taylor

(57) ABSTRACT

A method of making a semiconductor structure includes forming a select gate and a charge storage layer in an NVM region. A control gate is formed by depositing a conformal layer followed by an etch back. A patterned etch results in leaving a portion of the charge storage layer over the select gate and under the control gate and to remove the charge storage layer from the logic region. A logic gate structure formed in a logic region has a metal work function surrounded by an insulating layer.

19 Claims, 16 Drawing Sheets

(56) References Cited

U.S. PATENT DOCUMENTS

| | | | |
|---|---|---|---|
| 7,202,524 B2 | 4/2007 | Kim et al. | |
| 7,208,793 B2 | 4/2007 | Bhattacharyya | |
| 7,223,650 B2 | 5/2007 | Chang | |
| 7,256,125 B2 | 8/2007 | Yamada et al. | |
| 7,271,050 B2 | 9/2007 | Hill | |
| 7,365,389 B1 | 4/2008 | Jeon et al. | |
| 7,391,075 B2 | 6/2008 | Jeon et al. | |
| 7,402,493 B2 | 7/2008 | Oh et al. | |
| 7,405,968 B2 | 7/2008 | Mokhlesi et al. | |
| 7,439,134 B1 | 10/2008 | Prinz et al. | |
| 7,476,582 B2 | 1/2009 | Nakagawa et al. | |
| 7,521,314 B2 | 4/2009 | Jawarani et al. | |
| 7,524,719 B2 | 4/2009 | Steimle et al. | |
| 7,544,490 B2 | 6/2009 | Ferrari et al. | |
| 7,544,980 B2 | 6/2009 | Chindalore et al. | |
| 7,544,990 B2 | 6/2009 | Bhattacharyya | |
| 7,560,767 B2 | 7/2009 | Yasuda et al. | |
| 7,745,344 B2 | 6/2010 | Chindalore | |
| 7,795,091 B2 | 9/2010 | Winstead et al. | |
| 7,799,650 B2 | 9/2010 | Bo et al. | |
| 7,816,727 B2 | 10/2010 | Lai et al. | |
| 7,821,055 B2 | 10/2010 | Loiko et al. | |
| 7,906,396 B1 | 3/2011 | Chiang et al. | |
| 7,932,146 B2 | 4/2011 | Chen et al. | |
| 7,989,871 B2 | 8/2011 | Yasuda | |
| 7,999,304 B2 | 8/2011 | Ozawa et al. | |
| 8,003,482 B2 | 8/2011 | Brown | |
| 8,017,991 B2 | 9/2011 | Kim et al. | |
| 8,043,951 B2 | 10/2011 | Beugin et al. | |
| 8,063,434 B1 | 11/2011 | Polishchuk et al. | |
| 8,093,128 B2 | 1/2012 | Koutny et al. | |
| 8,138,037 B2 | 3/2012 | Chudzik et al. | |
| 8,168,493 B2 | 5/2012 | Kim | |
| 8,173,505 B2 | 5/2012 | Herrick et al. | |
| 8,216,947 B2 | 7/2012 | Lee | |
| 8,298,885 B2 | 10/2012 | Wei et al. | |
| 8,334,198 B2 | 12/2012 | Chen et al. | |
| 8,372,699 B2 | 2/2013 | Kang et al. | |
| 8,389,365 B2 | 3/2013 | Shroff et al. | |
| 8,399,310 B2 | 3/2013 | Shroff et al. | |
| 8,524,557 B1* | 9/2013 | Hall et al. | 438/268 |
| 8,536,006 B2 | 9/2013 | Shroff et al. | |
| 8,536,007 B2* | 9/2013 | Hall et al. | 438/268 |
| 8,679,927 B2 | 3/2014 | Ramkumar et al. | |
| 8,871,598 B1* | 10/2014 | Perera | 438/299 |
| 8,901,632 B1 | 12/2014 | Perera et al. | |
| 8,937,011 B2 | 1/2015 | Iuchi | |
| 8,969,206 B1 | 3/2015 | Sel | |
| 9,112,056 B1 | 8/2015 | Shroff | |
| 2001/0049166 A1 | 12/2001 | Peschiaroli et al. | |
| 2002/0061616 A1 | 5/2002 | Kim et al. | |
| 2003/0022434 A1 | 1/2003 | Taniguchi et al. | |
| 2004/0075133 A1 | 4/2004 | Nakagawa et al. | |
| 2004/0188753 A1 | 9/2004 | Kawashima et al. | |
| 2004/0262670 A1 | 12/2004 | Takebuchi et al. | |
| 2005/0145949 A1 | 7/2005 | Sadra et al. | |
| 2005/0247962 A1 | 11/2005 | Bhattacharyya | |
| 2006/0038240 A1 | 2/2006 | Tsutsumi et al. | |
| 2006/0046449 A1 | 3/2006 | Liaw | |
| 2006/0099798 A1 | 5/2006 | Nakagawa | |
| 2006/0134864 A1 | 6/2006 | Higashitani et al. | |
| 2006/0211206 A1 | 9/2006 | Rao et al. | |
| 2006/0221688 A1 | 10/2006 | Shukuri et al. | |
| 2007/0037343 A1 | 2/2007 | Colombo et al. | |
| 2007/0077705 A1 | 4/2007 | Prinz et al. | |
| 2007/0115725 A1 | 5/2007 | Pham et al. | |
| 2007/0215917 A1 | 9/2007 | Taniguchi | |
| 2007/0224772 A1 | 9/2007 | Hall et al. | |
| 2007/0249129 A1 | 10/2007 | Hall et al. | |
| 2007/0264776 A1 | 11/2007 | Dong et al. | |
| 2008/0029805 A1* | 2/2008 | Shimamoto et al. | 257/315 |
| 2008/0050875 A1 | 2/2008 | Moon et al. | |
| 2008/0067599 A1 | 3/2008 | Tsutsumi et al. | |
| 2008/0105945 A1 | 5/2008 | Steimle et al. | |
| 2008/0121983 A1 | 5/2008 | Seong et al. | |
| 2008/0128785 A1 | 6/2008 | Park et al. | |
| 2008/0145985 A1 | 6/2008 | Chi | |
| 2008/0185635 A1* | 8/2008 | Yanagi et al. | 257/325 |
| 2008/0237690 A1 | 10/2008 | Anezaki et al. | |
| 2008/0237700 A1 | 10/2008 | Kim et al. | |
| 2008/0283900 A1 | 11/2008 | Nakagawa et al. | |
| 2008/0290385 A1 | 11/2008 | Urushido | |
| 2008/0308876 A1 | 12/2008 | Lee et al. | |
| 2009/0050955 A1 | 2/2009 | Akita et al. | |
| 2009/0065845 A1 | 3/2009 | Kim et al. | |
| 2009/0072274 A1 | 3/2009 | Knoefler et al. | |
| 2009/0078986 A1 | 3/2009 | Bach | |
| 2009/0101961 A1 | 4/2009 | He et al. | |
| 2009/0111229 A1 | 4/2009 | Steimle et al. | |
| 2009/0179283 A1 | 7/2009 | Adams et al. | |
| 2009/0225602 A1 | 9/2009 | Sandhu et al. | |
| 2009/0256211 A1 | 10/2009 | Booth, Jr. et al. | |
| 2009/0263749 A1 | 10/2009 | Sim | |
| 2009/0269893 A1 | 10/2009 | Hashimoto et al. | |
| 2009/0273013 A1* | 11/2009 | Winstead et al. | 257/315 |
| 2009/0278187 A1 | 11/2009 | Toba | |
| 2011/0031548 A1 | 2/2011 | White et al. | |
| 2011/0095348 A1 | 4/2011 | Chakihara et al. | |
| 2011/0204450 A1 | 8/2011 | Moriya | |
| 2011/0260258 A1 | 10/2011 | Zhu et al. | |
| 2012/0034751 A1 | 2/2012 | Ariyoshi et al. | |
| 2012/0104483 A1 | 5/2012 | Shroff et al. | |
| 2012/0132978 A1* | 5/2012 | Toba et al. | 257/316 |
| 2012/0142153 A1 | 6/2012 | Jeong | |
| 2012/0248523 A1 | 10/2012 | Shroff et al. | |
| 2012/0252171 A1 | 10/2012 | Shroff et al. | |
| 2013/0026553 A1 | 1/2013 | Horch | |
| 2013/0037886 A1 | 2/2013 | Tsai et al. | |
| 2013/0065366 A1 | 3/2013 | Thomas et al. | |
| 2013/0084684 A1 | 4/2013 | Ishii et al. | |
| 2013/0137227 A1 | 5/2013 | Shroff et al. | |
| 2013/0171785 A1 | 7/2013 | Shroff et al. | |
| 2013/0171786 A1* | 7/2013 | Shroff et al. | 438/266 |
| 2013/0178027 A1 | 7/2013 | Hall et al. | |
| 2013/0178054 A1 | 7/2013 | Shroff et al. | |
| 2013/0264633 A1* | 10/2013 | Hall et al. | 257/326 |
| 2013/0264634 A1* | 10/2013 | Hall et al. | 257/326 |
| 2013/0267072 A1 | 10/2013 | Hall et al. | |
| 2013/0267074 A1 | 10/2013 | Hall et al. | |
| 2013/0323922 A1 | 12/2013 | Shen et al. | |
| 2014/0035027 A1 | 2/2014 | Chakihara et al. | |
| 2014/0050029 A1 | 2/2014 | Kang et al. | |
| 2014/0120713 A1 | 5/2014 | Shroff et al. | |
| 2014/0227843 A1 | 8/2014 | Tsukamoto et al. | |
| 2015/0054044 A1 | 2/2015 | Perera et al. | |

OTHER PUBLICATIONS

Office Action mailed Dec. 24, 2013 in U.S. Appl. No. 13/790,225.
Office Action mailed Dec. 24, 2013 in U.S. Appl. No. 13/790,014.
Office Action mailed Dec. 31, 2013 in U.S. Appl. No. 13/442,142.
Office Action mailed Jan. 16, 2014 in U.S. Appl. No 13/491,771.
Chen, J.H., et al., "Nonvolatile Flash Memory Device Using Ge Nanocrystals Embedded in HfA10 High-k Tunneling and Control Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAIO-SiO2 tunnel layer", Sciencedirect. com, Solid-State Electronics, vol. 61, Issue 1, Jul. 2011, pp. 100-105, http://wwww.sciencedirect.com/science/article/pii/S0038110111000803.
Krishnan, S., et al., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1. 4, pp. 634-637.
Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.
Liu, Z., et al., "Metal Nanocrystal Memories—Part I: Device Design and Fabrication", IEEE Transactions on Electron Devices, vol. 49, No. 9, Sep. 2002, pp. 1606-1613.

(56) References Cited

OTHER PUBLICATIONS

Mao, P., et al., "Nonvolatile memory devices with high density ruthenium nanocrystals", Applied Physics Letters, vol. 93, Issue 24, Electronic Transport and Semiconductors, 2006.

Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

Wang, X.P., et al., Dual Metal Gates with Band-Edge Work Functions on Novel HfLaO High-K Gate Dielectric, IEEE, Symposium on VLSI Technology Digest of Technical Papers, 2006.

U.S. Appl. No. 13/402,426, Hall, M.D., et al., "Non-Volatile Memory Cell and Logic Transistor Integration", Office Action—Allowance—May 3, 2013.

U.S. Appl. No. 13/789,971, Hall, M.D., et al, "Integration Technique Using Thermal Oxide Select Gate Dielectric for Select Gate and Replacement Gate for Logic ", Office Action—Allowance—May 15, 2013.

U.S. Appl. No. 13/491,771, Hall et al , "Integrating Formation of a Replacement Ggate Transistor and A Non-Volatile Memory Cell Using a High-K Dielectric", Office Action—Rejection, Sep. 9, 2013.

U.S. Appl. No. 13/442,142, Hall, M.D., et al., "Logic Transistor and Non-Volatile Memory Cell Integration", Office Action—Ex Parte Quayle, Apr. 4, 2013.

U.S. Appl. No. 13/442,142, Hall, M.D., et al., "Logic Transistor and Non-Volatile Memory Cell Integration", Office Action—Allowance, Aug. 2, 2013.

U.S. Appl. No. 13/907,491, Hall, M.D., et al., "Logic Transistor and Non-Volatile Memory Cell Integration", Office Action—Rejection, Sep. 13, 2013.

U.S. Appl. No. 12/915,726, Shroff, M., et al., "Non-Volatile Memory and Logic Circuit Process Integration", Office Action—Restriction, Jul. 31, 2012.

U.S. Appl. No. 12/915,726, Shroff, M., et al., "Non-Volatile Memory and Logic Circuit Process Integration", Office Action—Allowance, Dec. 10, 2012.

U.S. Appl. No. 13/781,727, Shroff, M., et al., "Methods of Making Logic Transistors and non-Volatile Memory Cells", Office Action—Rejection, Aug. 22, 2013.

U.S. Appl. No. 13/077,491, Shroff, M.., et al., "Non-Volatile Memory and Logic Circuit Process Integration", Office Action—Rejection, Aug. 15, 2012.

U.S. Appl. No. 13/077,491, Shroff, M.., et al., "Non-Volatile Memory and Logic Circuit Process Integration", Office Action—Rejection, Feb. 6, 2013.

U.S. Appl. No. 13/077,491, Shroff, M.., et al., "Non-Volatile Memory and Logic Circuit Process Integration", Office Action—Allowance, Jun. 18, 2013.

U.S. Appl. No. 13/077,501, Shroff, M.., et al., "Non-Volatile Memory and Logic Circuit Process Integration", Office Action—Allowance, Nov. 26, 2012.

U.S. Appl. No. 13/313,179, Shroff, M., et al., "Method of Protecting Against Via Failure and Structure Therefor", Office Action—Rejection, Aug. 15, 2013.

U.S. Appl. No. 13/307,719, Shroff, M., et al., "Logic and Non-Volatile Memory (NVM) Integration", Office Action—Allowance, May 29, 2013.

U.S. Appl. No. 13/343,331, Shroff, M., et al., "Non-Volatile Memory (NVM) and Logic Integration", Office Action—Rejection, Mar. 13, 2013.

U.S. Appl. No. 13/343,331, Shroff, M., et al., "Non-Volatile Memory (NVM) and Logic Integration", Office Action—Allowance, Jun. 24, 2013.

U.S. Appl. No. 13/441,426, Shroff, M., et al., "Non-Volatile Memory (NVM) and Logic Integration", Office Action—Allowance, Sep. 9, 2013.

U.S. Appl. No. 13/780,574, Hall, M.D., et al., Non-Volatile Memory (NVM) and Logic Integration, Office Action—Allowance, Sep. 6, 2013.

U.S. Appl. No. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.

U.S. Appl. No. 13/491,771, Hall, M., et al., "Integrating Formation of a Replacement Gate Transistor and a Non-Volatile Memory Cell Using a High-K Dielectric", filed Jun. 8, 2012.

U.S. Appl. No. 13/790,225, Hall, M., et al., "Integrating Formation of a Replacement Gate Transistor and a non-Volatile Memory Cell Having Thin Film Storage", filed Mar. 8, 2013.

U.S. Appl. No. 13/790,014, Hall, M., et al., "Integrating Formation of a Logic Transistor and a None-Volatile Memory Cell Using a Partial Replacement Gate Technique", filed Mar. 8, 2013.

U.S. Appl. No. 13/955,665, Perera, A.H., "Non-Volatile Memory (NVM) and High K and Metal Gate Integration Using Gate First Methodology", filed Jul. 31, 2013.

U.S. Appl. No. 13/962,338, Perera, A.H., "Nonvolatile Memory Bitcell With Inlaid High K Metal Select Gate", filed Aug. 8, 2013.

U.S. Appl. No. 13/928,666, Hong, C. M., et al., "Non-Volatile Memory (NVM) and High Voltage Transistor Integration", filed Jun. 27, 2013.

U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.

U.S. Appl. No. 13/780,591, Hall, M.D., et al., "Non-Volatile Memory (NVM) and Logic Integration", filed Feb. 28, 2013.

U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.

U.S. Appl. No. 13/661,157, Shroff, M.D., et al., "Method of Making a Logic Transistor and a Non-Volatile Memory (NVM) Cell", file Oct. 26,2 012.

U.S. Appl. No. 13/781,727, Shroff, M., et al., "Methods of Making Logic Transistors and non-Volatile Memory Cells", Office Action—Restriction, Jun. 21, 2013.

Office Action mailed Jan. 31, 2014 in U.S. Appl. No. 13/781,727.

Office Action—Allowance mailed Feb. 21, 2014 in U.S. Appl. No. 13/441,426.

Office Action—Allowance mailed Feb. 28, 2014 in U.S. Appl. No. 13/442,142.

Office Action—Allowance mailed Mar. 3, 2014 in U.S. Appl. No. 13/790,014.

Office Action—Allowance mailed Mar. 6, 2014 in U.S. Appl. No. 13/491,771.

Office Action—Allowance mailed Mar. 11, 2014 in U.S. Appl. No. 13/907,491.

Office Action—Allowance mailed Mar. 12, 2014 for U.S. Appl. No. 13/790,225.

U.S. Appl. No. 13/781,727, Office Action—Allowance, May 12, 2014.

U.S. Appl. No. 13/441,426, Shroff, M. D., et al., Office Action—Allowance, mailed Jun. 9, 2014.

U.S. Appl. No. 13/907,491, Office Action—Rejection, Sep. 3, 2013.

U.S. Appl. No. 13/343,331, Office Action—Allowance, Nov. 8, 2013.

U.S. Appl. No. 13/971,987, Perera, A.H., et al., "Integrated Split Gate Non-Volatile Memory Cell and Logic Structure", filed Aug. 21, 2013.

U.S. Appl. No. 13/928,666, Hong, Office Action—Rejection, mailed Jul. 23, 2014.

U.S. Appl. No. 14/041,662, Perera, Office Action—Restriction, mailed Aug. 1, 2014.

U.S. Appl. No. 13/969,180, Perera, Office Action—Allowance, mailed Aug. 5, 2014.

U.S. Appl. No. 13/781,727, Shroff, Office Action—Allowance, mailed Aug. 15, 2014.

U.S. Appl. No. 13/955,665, Office Action—Allowance, mailed Aug. 20, 2014.

U.S. Appl. No. 13/973,549, Hong, Office Action—Restriction, mailed Aug. 26, 2014.

U.S. Appl. No. 13/441,426, Shroff, Office Action—Allowance, mailed Sep. 26, 2014.

(56) References Cited

OTHER PUBLICATIONS

U.S. Appl. No. 13/661,157, Office Action—Restriction, mailed Oct. 2, 2014.
U.S. Appl. No. 14/041,662, Perera, Office Action—Allowance, mailed Oct. 17, 2014.
Office Action mailed Jan. 16, 2014 in U.S. Appl. No. 13/491,771.
Office Action mailed Dec. 5, 2014 for U.S. Appl. No. 13/971,987, 5 pages.
Notice of Allowance mailed Jan. 22, 2015 for U.S. Appl. No. 13/790,004, 11 pages.
Office Action mailed Feb. 12, 2015 for U.S. Appl. No. 13/971,987, 7 pages.
Office Action mailed Dec. 5, 2014 for U.S. Appl. No. 13/962,338, 7 pages.
U.S. Appl. No. 14/291,359, filed May 30, 2014, entitled Split Gate Nanocrystal Memory Integration.
Notice of Allowance mailed Mar. 30, 2015 for U.S. Appl. No. 13/790,004, 5 pages.
Notice of Allowance mailed Apr. 27, 2015 for U.S. Appl. No. 13/971,987, 12 pages.
Notice of Allowance mailed May 13, 2014 for U.S. Appl. No. 13/962,338, 11 pages.
Restriction Requirement mailed May 14, 2015 for U.S. Appl. No. 14/291,359, 8 pages.
Restriction Requirement mailed Jul. 27, 2015 for U.S. Appl. No. 13/973,433, 7 pages.
Non-Final Office Action mailed Sep. 16, 2015 for U.S. Appl. No. 14/291,359, 7 pages.
Notice of Allowance mailed Nov. 4, 2015 for U.S. Appl. No. 13/973,433, 10 pages.

\* cited by examiner

INTEGRATED SPLIT GATE NON-VOLATILE MEMORY CELL AND LOGIC DEVICE

BACKGROUND

1. Field

This disclosure relates generally to methods of making semiconductor structures, and more specifically, to methods useful in integrating fabrication of a split gate non-volatile memory cell with a logic device such as a transistor.

2. Related Art

The integration of non-volatile memories (NVMs) with logic transistors has always been a challenge due to the different requirements for the NVM transistors, which store charge, and the logic transistors which are commonly intended for high speed operation. The need for storing charge has been addressed mostly with the use of floating gates but also with nanocrystals or nitride. In any of these cases, the need for this unique layer makes integration of the NVM transistors and the logic transistors difficult. The particular type of charge storage layer can also have a large effect on the options that are available in achieving the integration. Logic devices that use high-k gate dielectric are also becoming more in demand to reduce leakage effects as gate dielectric thickness scales below 2 nanometers.

Even though logic devices with gate lengths of 28 nanometers are currently being produced, NVM that uses control gate over floating gate configurations has not proven to be reliable at such small scale. Thus, NVM with nanocrystals are a more viable option as gate lengths decrease. It is therefore desirable to provide integrated circuits with both logic devices and NVM that are formed using the same processing technology as gate lengths scale to 28 nanometers or less.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and structures for semiconductor structures including non-volatile memory (NVM) split gate memory cells integrated with logic devices such as transistors with high-k gate dielectric are disclosed. The split gate memory cells include a select gate and a control gate. Layers of oxide and nitride are deposited over a region of the substrate that includes the split gate structure while a gate stack that includes high-k dielectric is deposited over a region of the substrate where the logic devices are being formed. An interlayer dielectric over the NVM and logic regions can be chemically-mechanically polished during fabrication, which results in the control gate needing to become a spacer along one side of the select gate for the NVM. Metal gate material for the logic devices is deposited after the ILD is polished. This is better understood by reference to the following description and the drawings.

Figure 1:
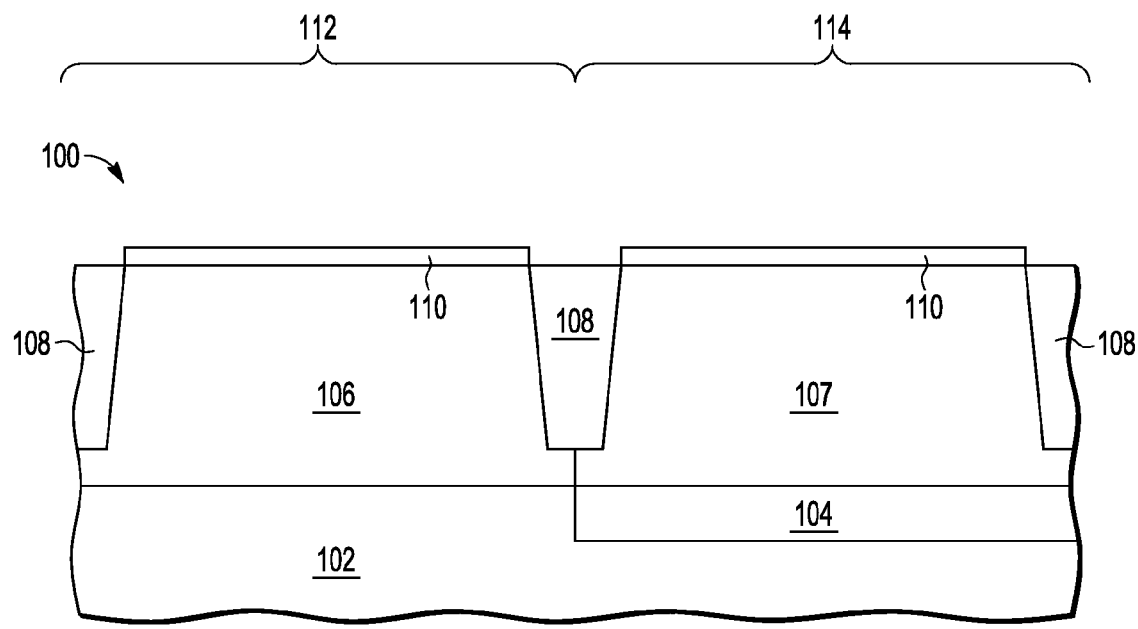
FIG. 1 is a semiconductor structure at a stage of fabrication according to a first embodiment.

Shown in FIG. 1 is an embodiment of semiconductor structure 100 at an intermediate stage of fabrication comprising a semiconductor substrate 102 with a deep N-well implant 104, NVM P-well 106, logic device P-well 107, isolation trench 108 with deposited oxide separating a majority portion of P-well 106 from a majority portion of P-well 107, and oxide layer 110 over P-well 106, P-well 107.

Semiconductor substrate 102 can be any semiconductor material or combinations of materials, such as gallium arsenide, silicon germanium, silicon-on-insulator (SOI), silicon, monocrystalline silicon, the like, and combinations of the above. Gate dielectric 110 may be a thermally grown oxide which is common for gate dielectrics and may be 30 to 120 Angstroms or other suitable dimension in thickness.

NVM region 112 includes NVM P-well 106 over which an NVM memory cell will be formed. Logic region 114 includes logic P-well 107 over which a logic device will be formed. It is noted that opposite polarities may be used in semiconductor structure 100, with P-wells 106, 107 being examples of polarity that may be used.

Figure 2:
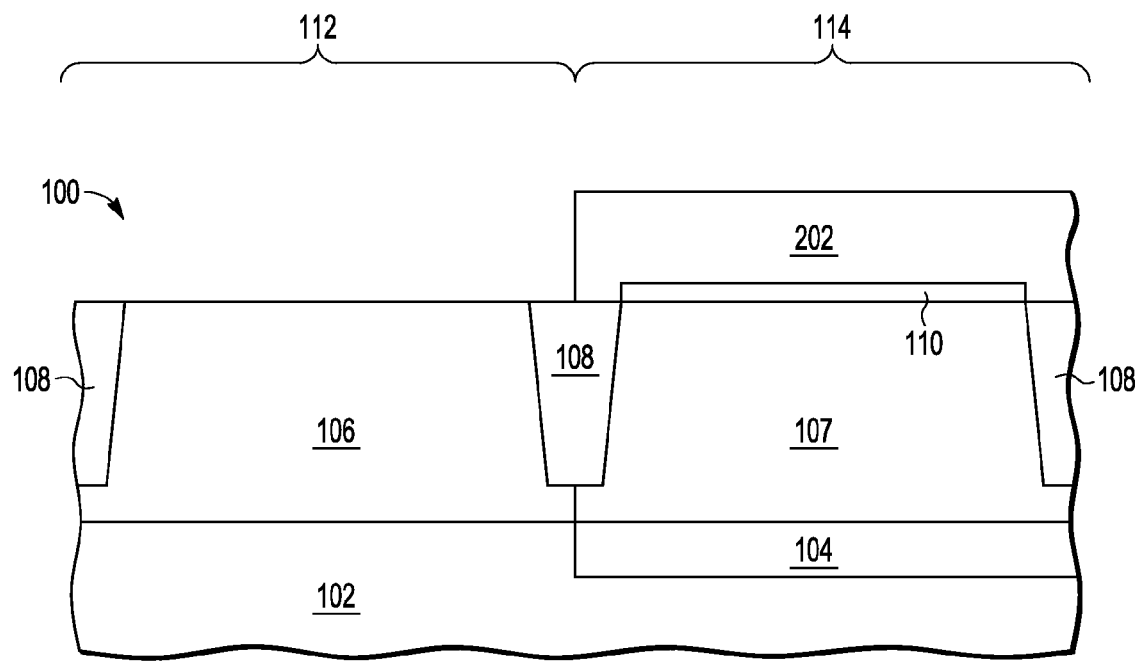
FIGS. 2-31 show the semiconductor structure of FIG. 1 at subsequent stages of fabrication.
Figure 3:
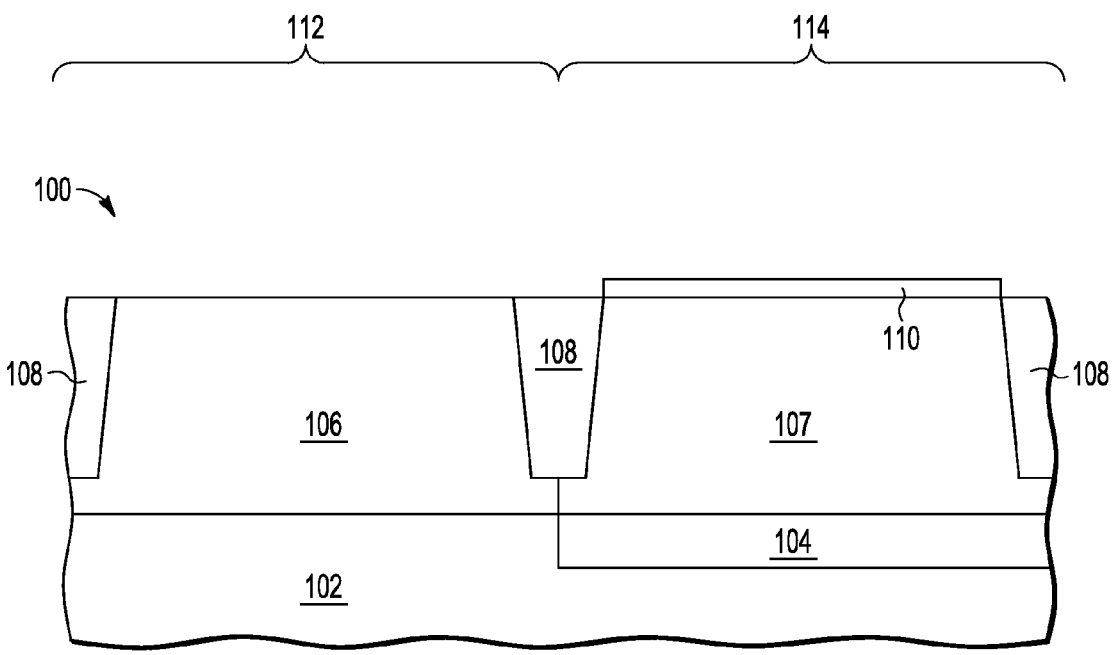

Shown in FIG. 2 is an embodiment of semiconductor structure 100 after depositing photoresist 202 over logic region 114 and performing an anisotropic etch or isotropic etch to remove gate dielectric 110 in NVM region 112. For the case of gate dielectric 110 being silicon oxide, a reactive ion etch (RIE), an HF wet etch, or other suitable etch can be used. After etching oxide layer 110 in NVM region 112, photoresist 202 over logic region 114 is removed, as shown in FIG. 3.

Figure 4:
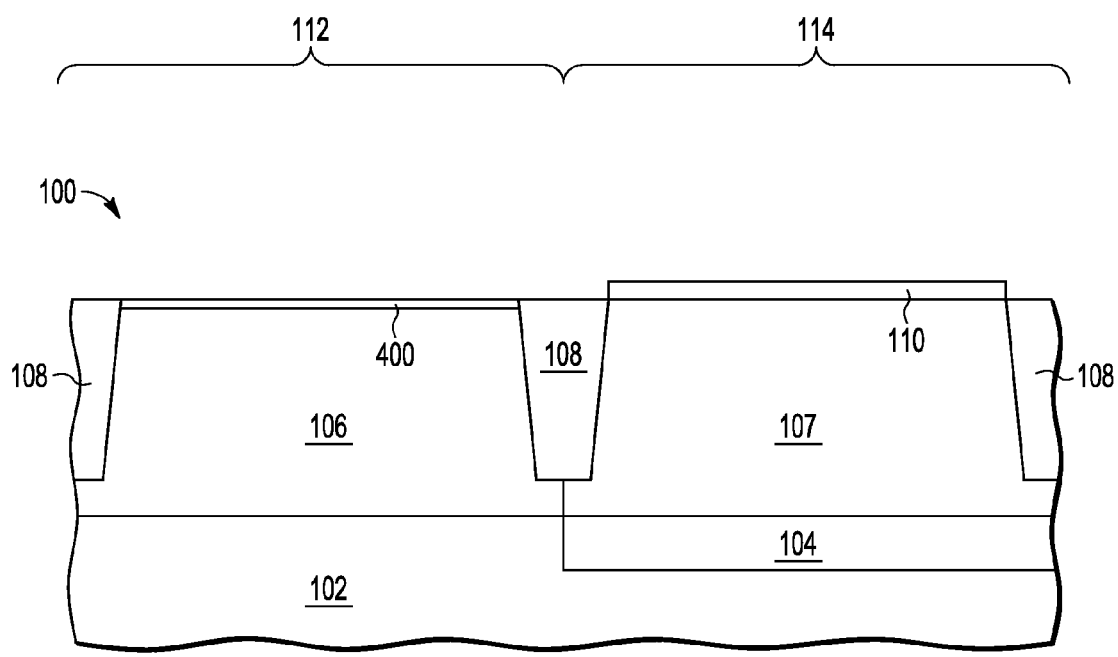

In FIG. 4, oxidation layer 400 is formed in the exposed surface of P-well 106 between isolation trenches 108 in NVM region 112. Oxide layer 400 can range from 20 to 40 Angstroms thick using wet or dry thermal oxidation.

Figure 5:
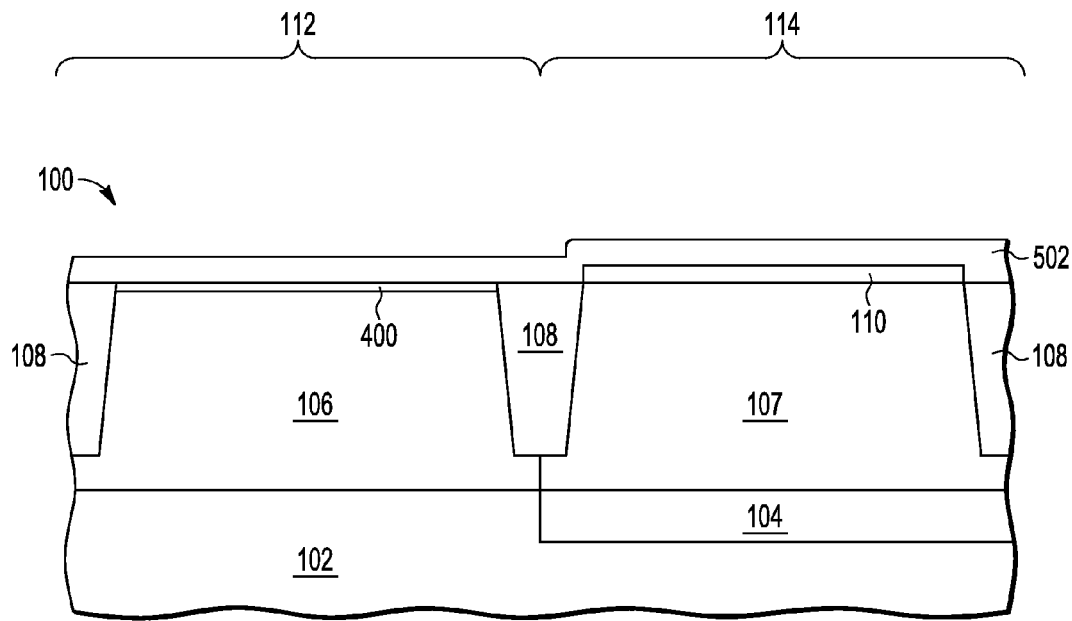

Shown in FIG. 5 is semiconductor structure 100 after a layer of polysilicon 502 is deposited in NVM region 112 and logic region 114. Polysilicon layer 502 can range from 500 to 800 Angstroms thick and be deposited using low pressure chemical vapor deposition (LPCVD).

Figure 6:
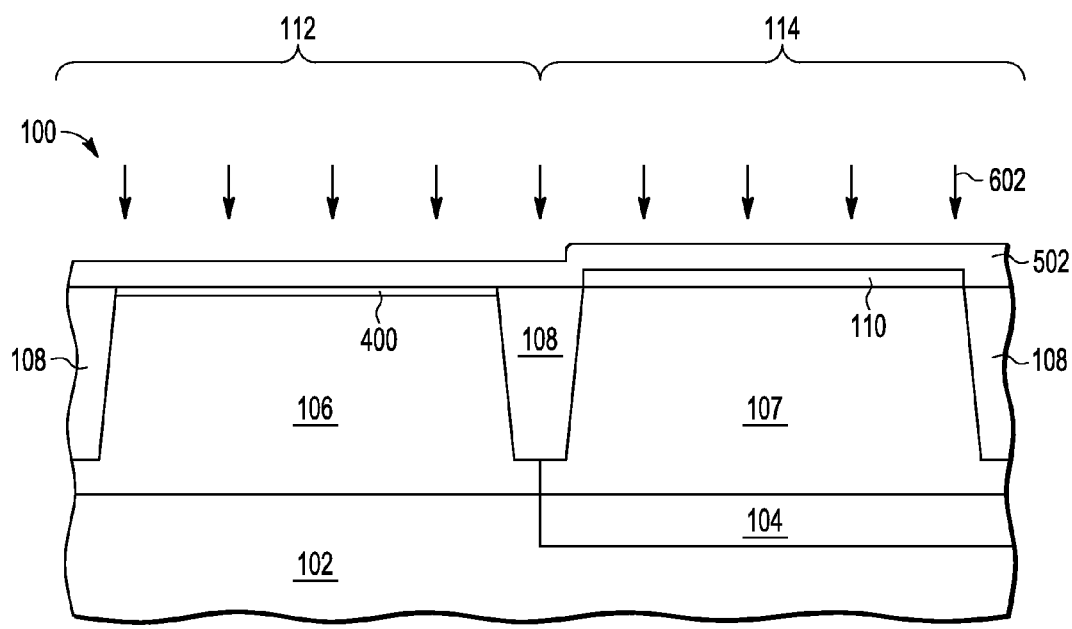

Shown in FIG. 6 is semiconductor structure 100 as polysilicon layer 502 is doped by implanting 602 an N-type ion. The doping may be implanted at any suitable depth, such as a depth that is approximately one-half the thickness of polysilicon layer 502.

Figure 7:
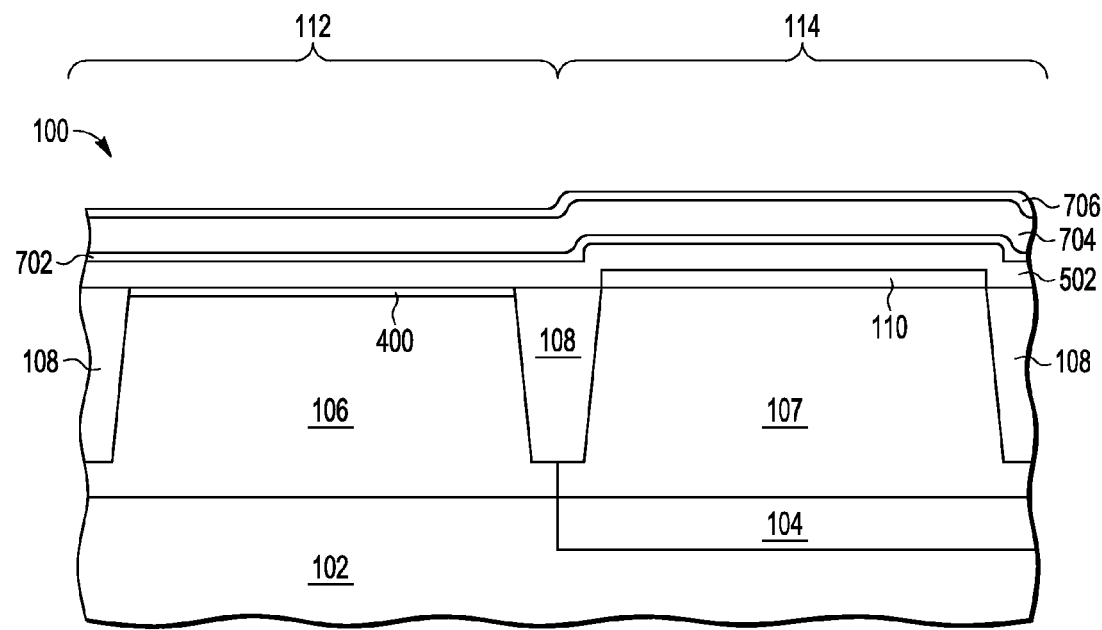

Shown in FIG. 7 is semiconductor structure 100 after oxide layer 702, nitride layer 704 and oxide layer 706 have been deposited over polysilicon layer 502 in NVM region 112 and logic region 114. Oxide layer 702 can range from approximately 30 to 60 Angstroms in thickness. Nitride layer 704 can range from approximately 200 to 300 Angstroms in thickness and oxide layer 706 can range from approximately 50 to 100 Angstroms in thickness. Other suitable thicknesses for layers 702-706 can be used. For example, a thicker nitride layer 704 can be used to increase the height of the sidewall. A taller sidewall will provide greater area to be available when subsequently forming a control gate, as further discussed herein below. The stress in nitride layer 704 can be chosen to reduce the impact on a select gate transistor channel to be subsequently formed. Layers 702-706 can be deposited using chemical vapor deposition (CVD).

Figure 8:
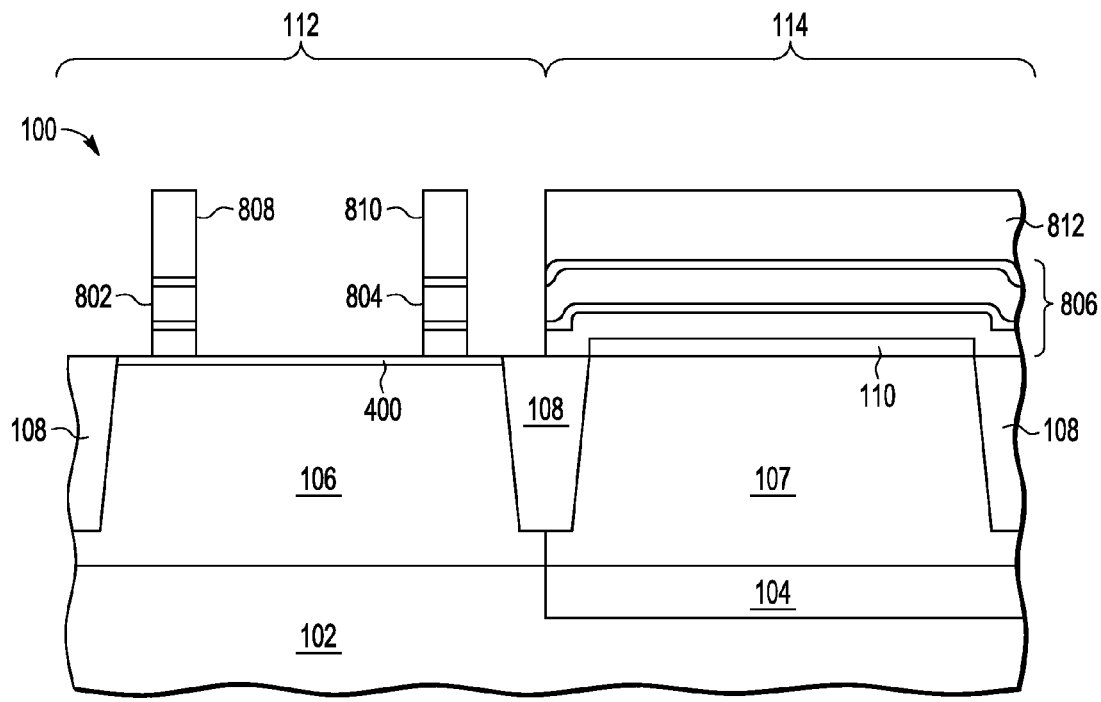
Figure 9:
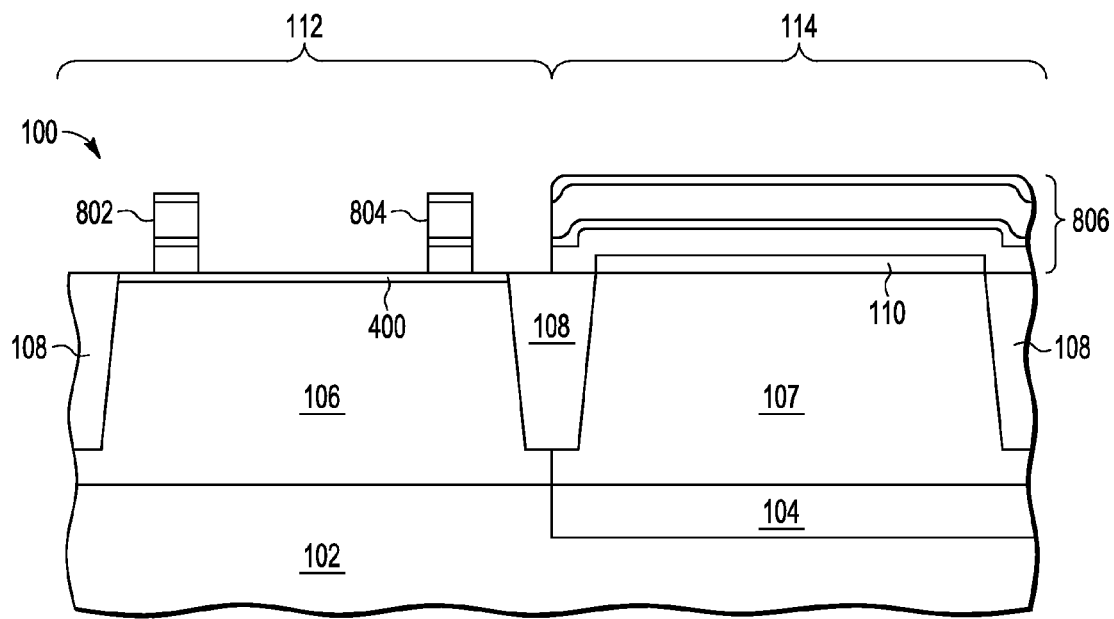

Shown in FIG. 8 is semiconductor structure 100 after photoresist portions 808, 810 are patterned and layers 502 (FIG. 6), 702-706 (FIG. 7) over NVM region 112 are etched to form gate stacks 802, 804 for NVM cells. Photoresist portion 812 remains over layers 502 (FIG. 5), 702-706 (FIG. 7), which are collectively referred to as "hard mask 806", in logic region 114 while gate stacks 802, 804 are etched. Photoresist portions 808, 810 and 812 are then removed, as shown in FIG. 9.

Figure 10:
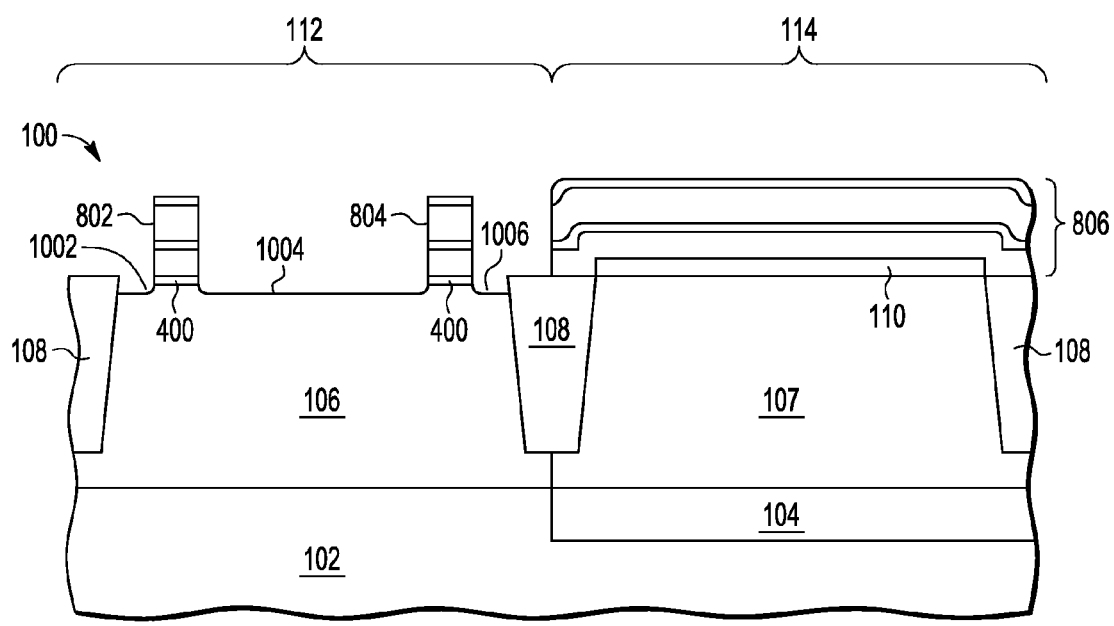

Shown in FIG. 10 is semiconductor structure 100 after recesses 1002, 1004 and 1006 in P-well 106 are dry etched around gate stacks 802, 804 in NVM region 112. Recesses 1002, 1004 and 1006 can have a depth of approximately 200 to 400 Angstroms or other suitable depth.

Figure 11:
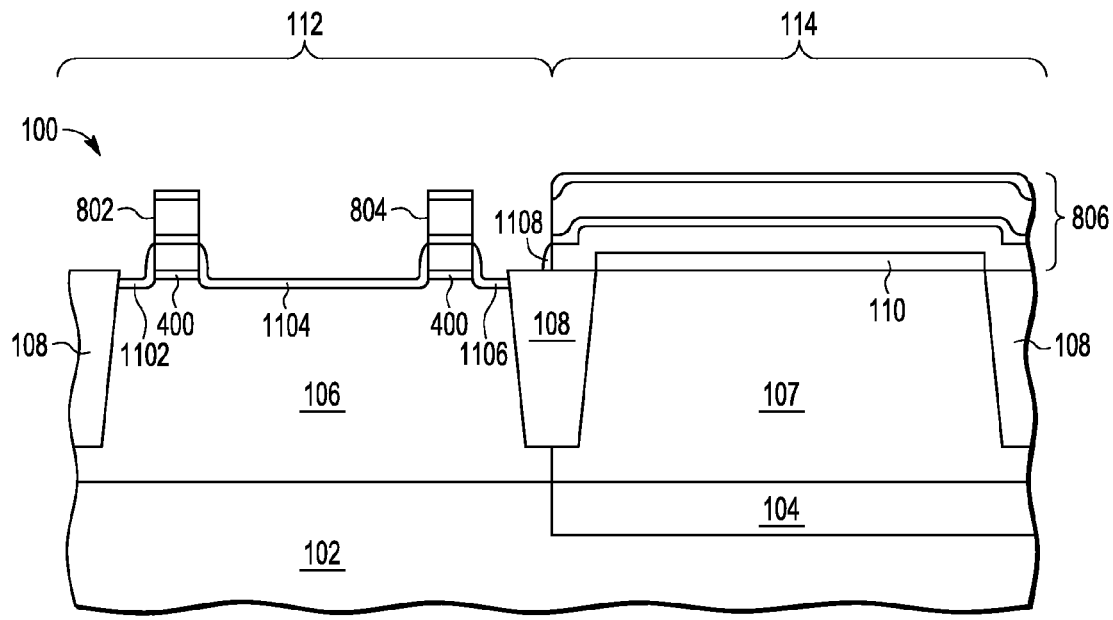

Shown in FIG. 11 is semiconductor structure 100 after repair oxide portions 1102, 1104, 1106 are grown in recesses 1002, 1004, 1006 using high temperature oxidation. Oxide portions 1102, 1104, 1106 are used to repair damage to the surface of P-well 106 that can occur during the etching process and can have a thickness of approximately 50 to 150 Angstroms. Other suitable thicknesses can be used.

Figure 12:
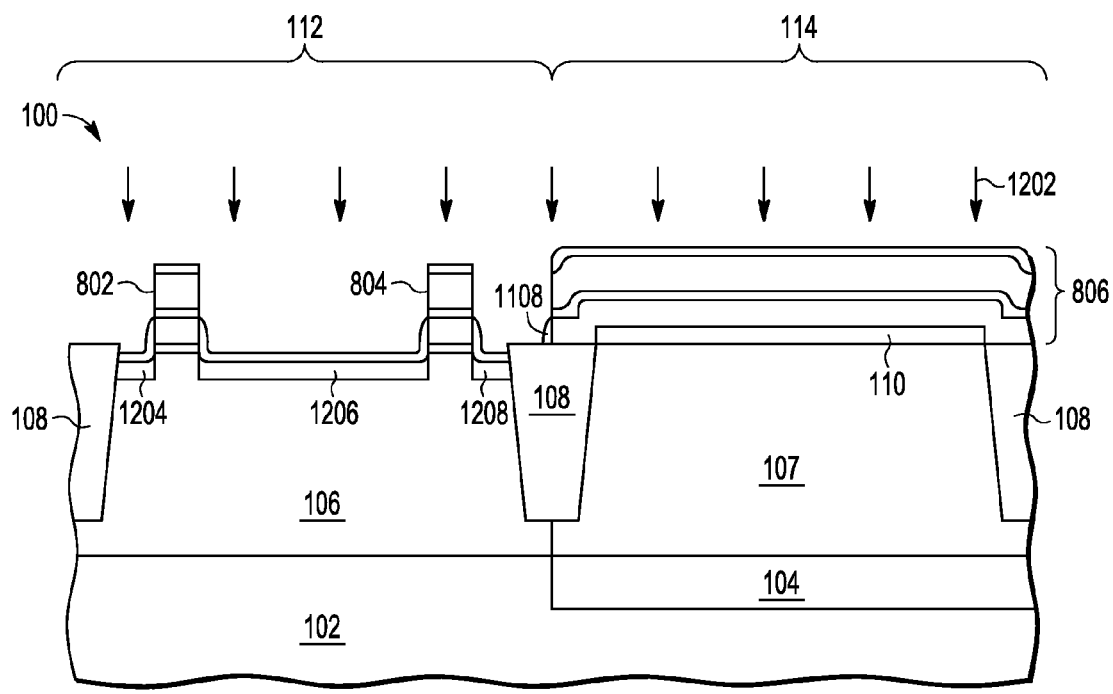

Shown in FIG. 12 is semiconductor structure 100 showing implantation process 1202, also referred to as "counterdoping", forming implant regions 1204, 1206, 1208 under repair oxide portion 1102-1106. Implant regions 1204, 1206, 1208 (also referred to as extension implants) are of a dopant type opposite that of polarity of the region in which they are formed. In the example shown, implant regions 1204-1208 have N-type polarity since P-well region 106 has P-type polarity.

Figure 13:
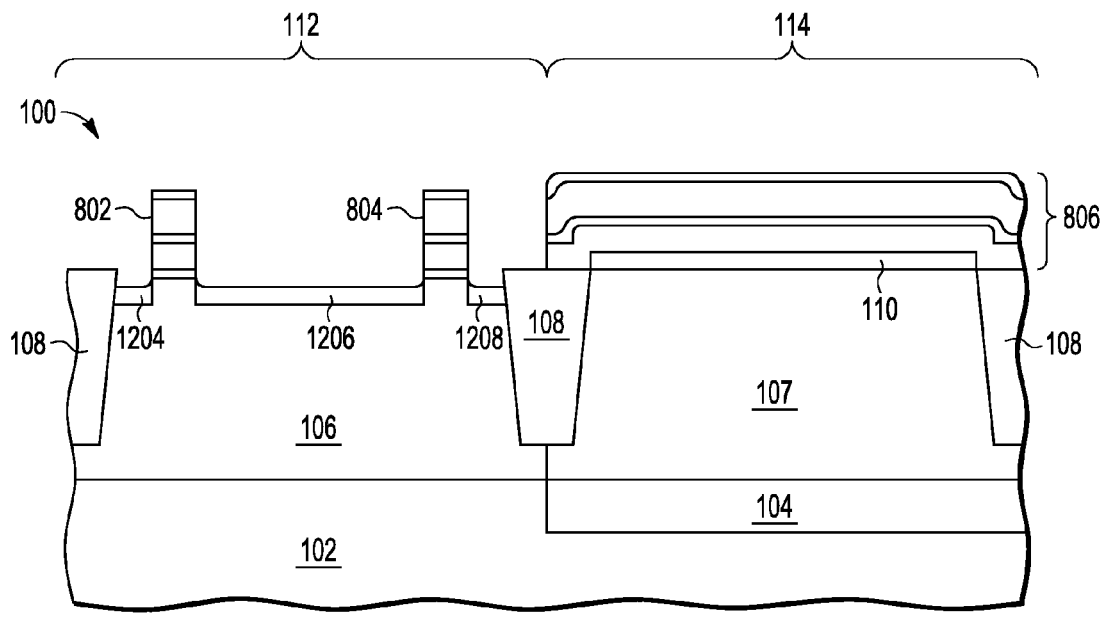

Shown in FIG. 13 is semiconductor structure 100 after repair oxide portions 1102-1106 are removed by etching or other suitable technique.

Figure 14:
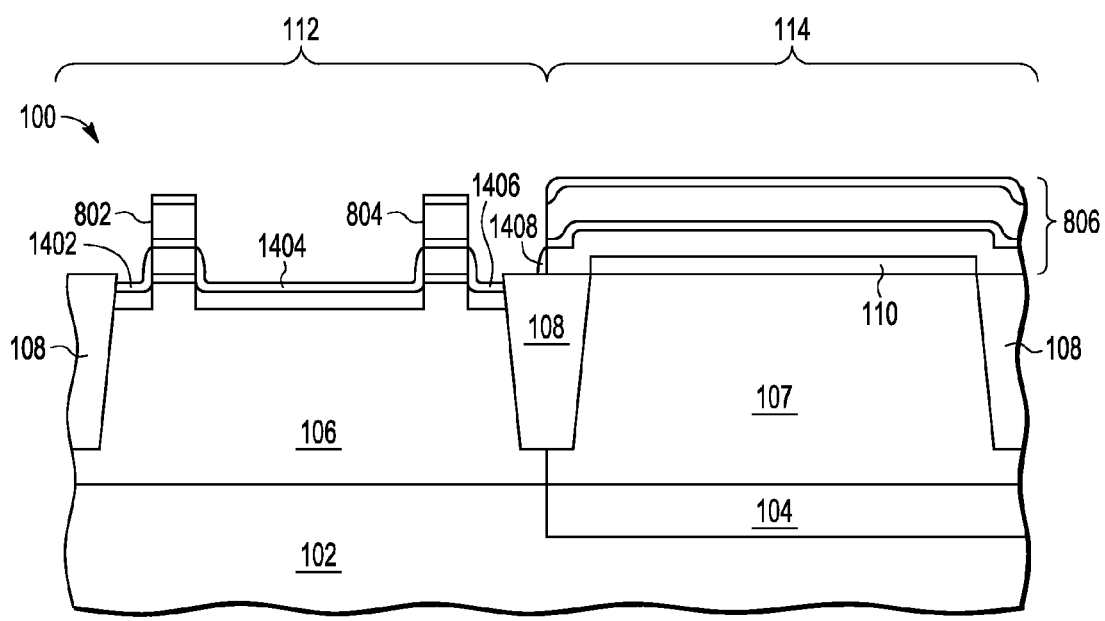

Shown in FIG. 14 is semiconductor structure 100 after bottom oxide portions 1402, 1404, 1406 are formed above implant regions 1204-1208. Oxide portion 1408 is also formed along an exposed sidewall of polysilicon layer (502, FIG. 5) of hard mask 806 at the border of NVM region 112 and logic region 114. Bottom oxide portions 1402, 1404, 1406, 1408 can range from 50 to 150 Angstroms or other suitable thickness, and formed using high temperature oxidation.

Figure 15:
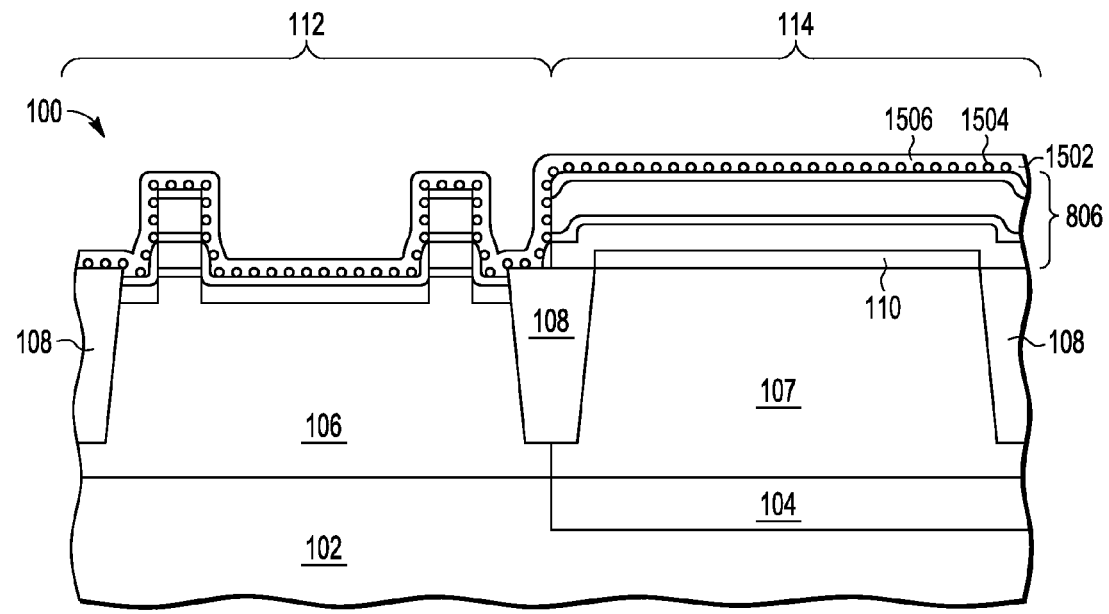

Shown in FIG. 15 is semiconductor structure 100 after forming a charge storage layer 1502 (also referred to as a conformal conductive layer) over the top of NVM region 112 and logic region 114. Charge storage layer 1502 may be formed by depositing and annealing discrete storage elements of polysilicon, germanium, metal, silicon carbide, or other suitable metal or silicon material or any combinations of these materials. In the illustrated embodiment, charge storage layer 1502 includes small circles representing nanocrystals 1504, however, charge storage layer 1502 may be formed of a continuous layer of silicon nitride, polysilicon or other suitable material. Charge storage layer 1502 may be between 50 and 300 Angstroms thick. Bottom oxide portions 1402, 1404, 1406, 1408 may be a thermal layer in order to withstand the heat of nanocrystal formation. A high-k dielectric material may be used as bottom oxide portions 1402, 1404, 1406, 1408 with metal nanocrystals or when a lower temperature silicon nanocrystal formation process is used. Dielectric layer 1506 is formed over the charge storage layer 1502 to isolate charge storage layer 1502 from subsequently formed layers.

Figure 16:
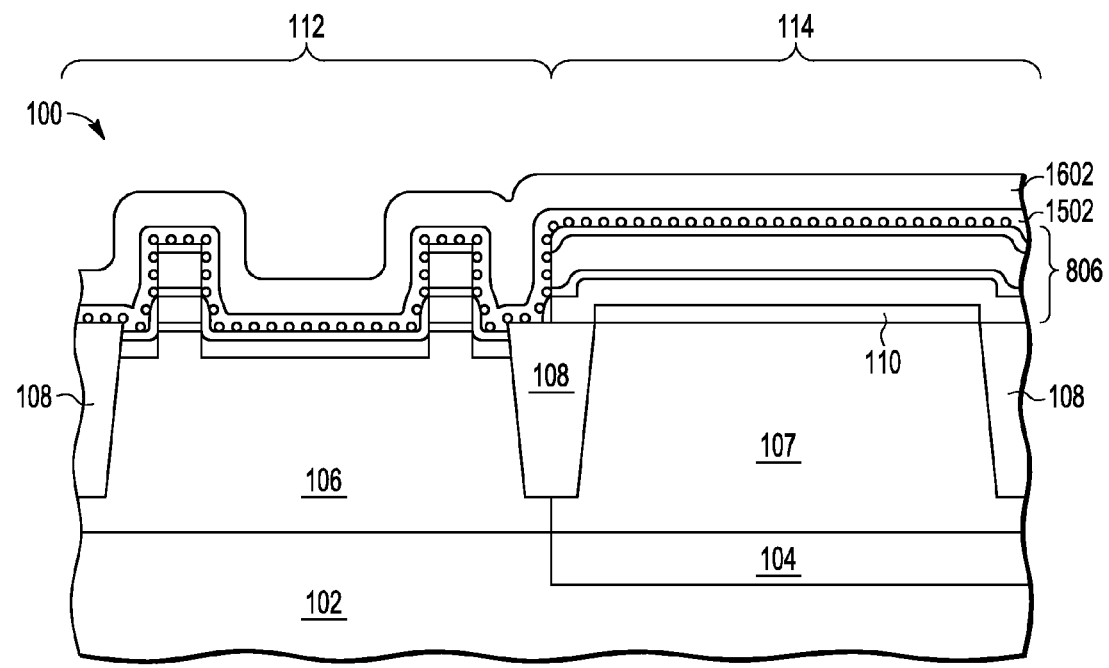

Shown in FIG. 16 is semiconductor structure 100 after a layer of polysilicon 1602 is deposited in NVM region 112 and logic region 114. Polysilicon layer 1602 can range from 500 to 800 Angstroms thick and be deposited using low pressure chemical vapor deposition (LPCVD).

Figure 17:
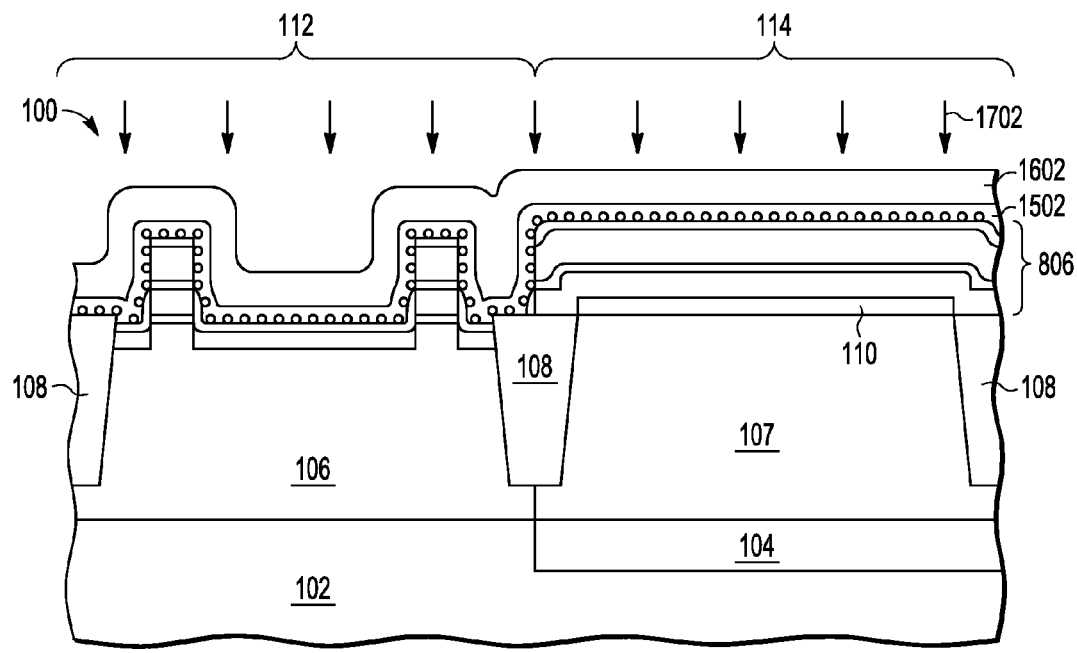

Shown in FIG. 17 is semiconductor structure 100 as polysilicon layer 1602 is doped by implanting 1702, such as with an N-type dopant. The doping may be implanted at any suitable depth, such as a depth that is approximately one-half the thickness of polysilicon layer 1602.

Figure 18:
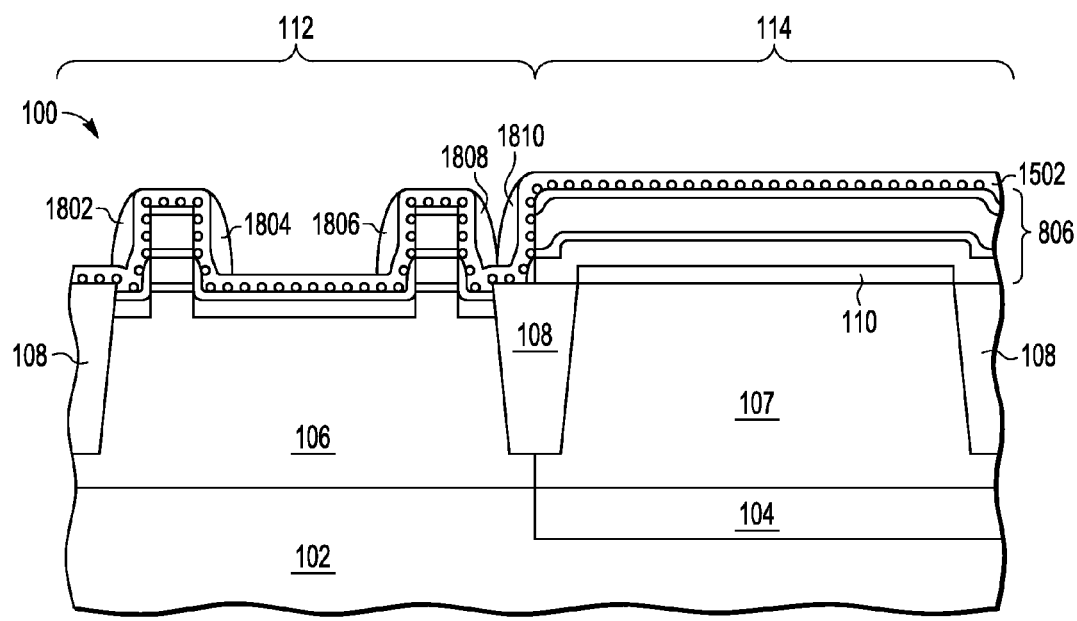

Shown in FIG. 18 is semiconductor structure 100 after polysilicon layer 1602 is etched to form sidewall spacers 1802, 1804 on select gate stack 802 (FIG. 8), sidewall spacers 1806, 1808 on select gate stack 804 (FIG. 8), and sidewall spacer 1810 on a sidewall of charge storage layer 1502.

Figure 19:
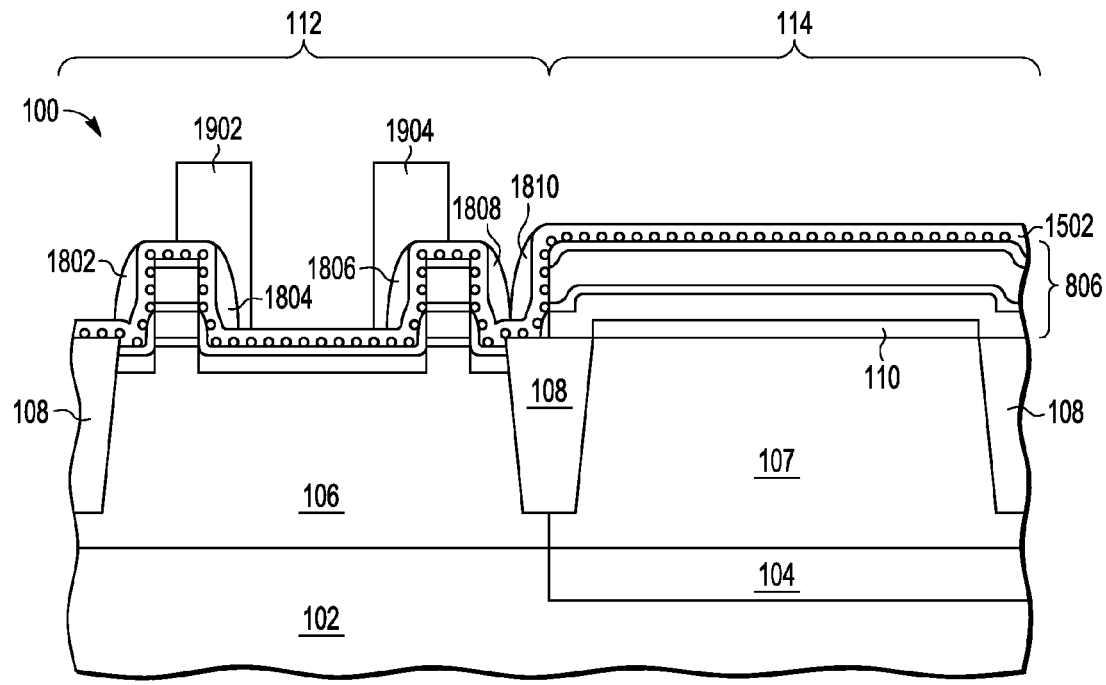

Shown in FIG. 19 is semiconductor structure 100 after photoresist regions 1902, 1904 are deposited and patterned over respective spacers 1804, 1806 and adjacent portions of charge storage layer 1502.

Figure 20:
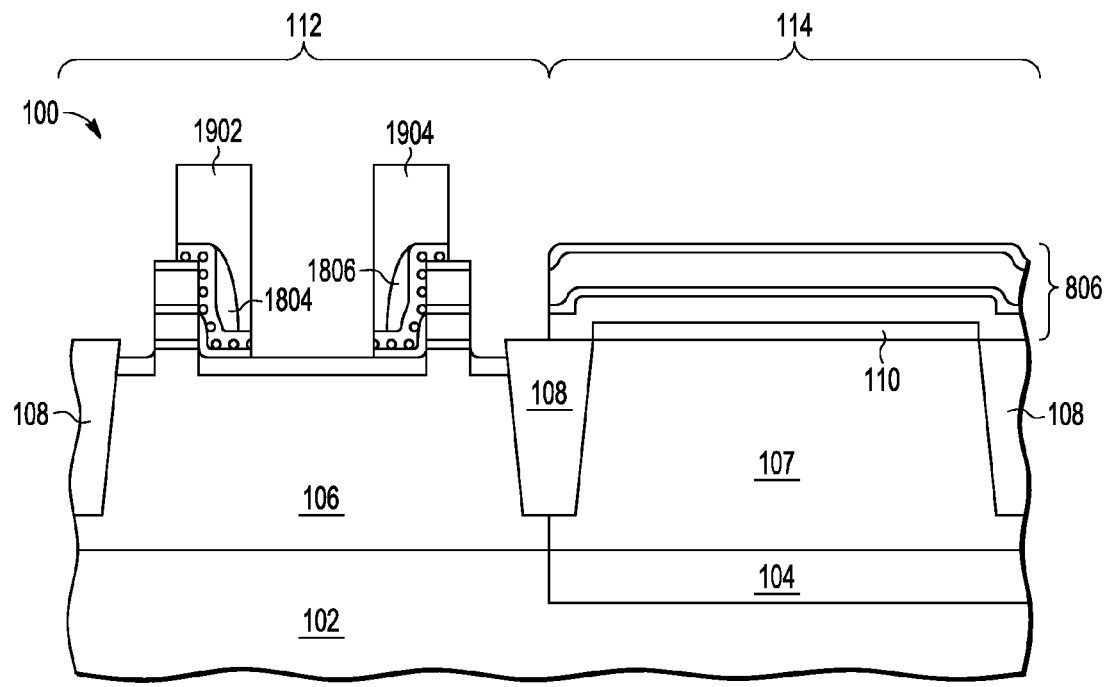

Shown in FIG. 20 is semiconductor structure 100 after sections of charge storage layer 1502 (FIG. 15) and bottom oxide 1402-1408 (FIG. 14) are removed in areas that are not protected by photoresist regions 1902, 1904.

Figure 21:
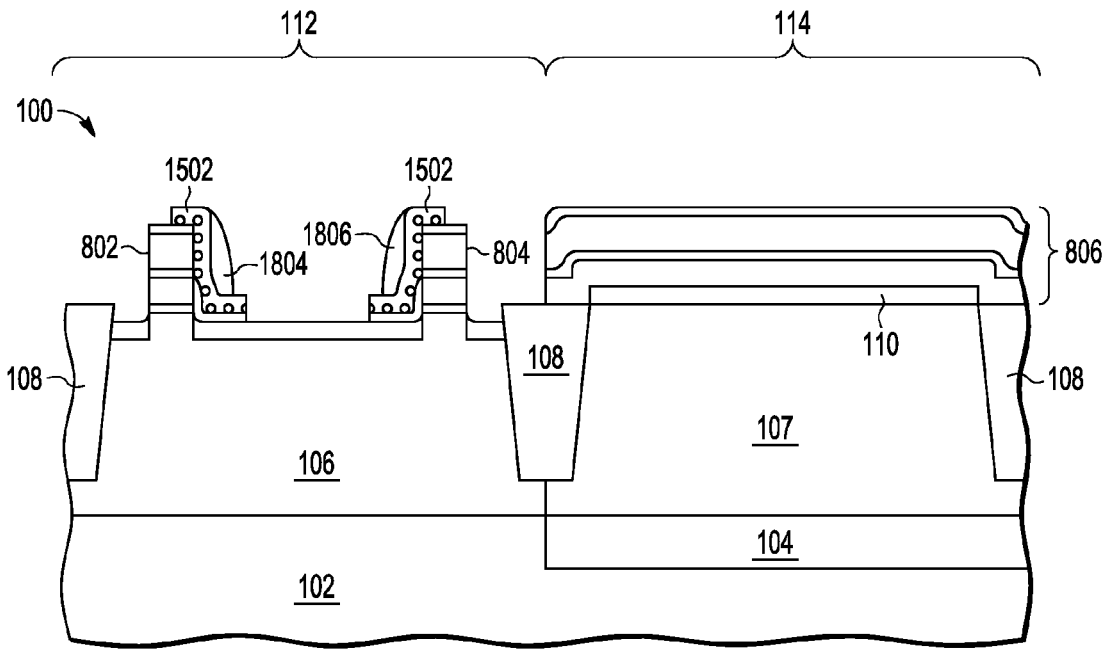

Shown in FIG. 21 is semiconductor structure 100 after photoresist regions 1902, 1904 are removed, leaving sections of charge storage layer 1502 (FIG. 15) over a section of the top and one side of respective select gate stacks 802, 804. Spacers 1804, 1806 remain adjacent respective sections of charge storage layer 1502.

Figure 22:
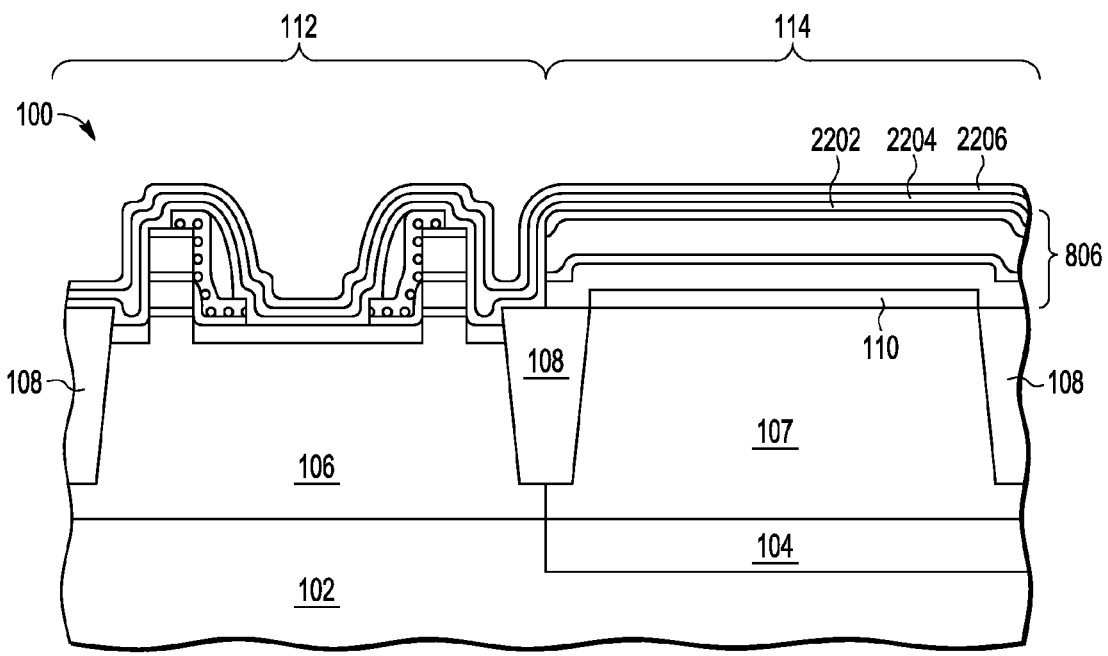

Shown in FIG. 22 is semiconductor structure 100 after oxide layer 2202, nitride layer 2204 and oxide layer 2206 have been deposited over NVM region 112 and logic region 114. Oxide layer 2202 can range from approximately 50 to 150 Angstroms in thickness. Nitride layer 2204 can range from approximately 200 to 300 Angstroms in thickness and oxide layer 2206 can range from approximately 30 to 100 Angstroms in thickness. Other suitable thicknesses for layers 2202-2206 can be used. Layers 2202-2206 can be deposited using chemical vapor deposition (CVD).

Figure 23:
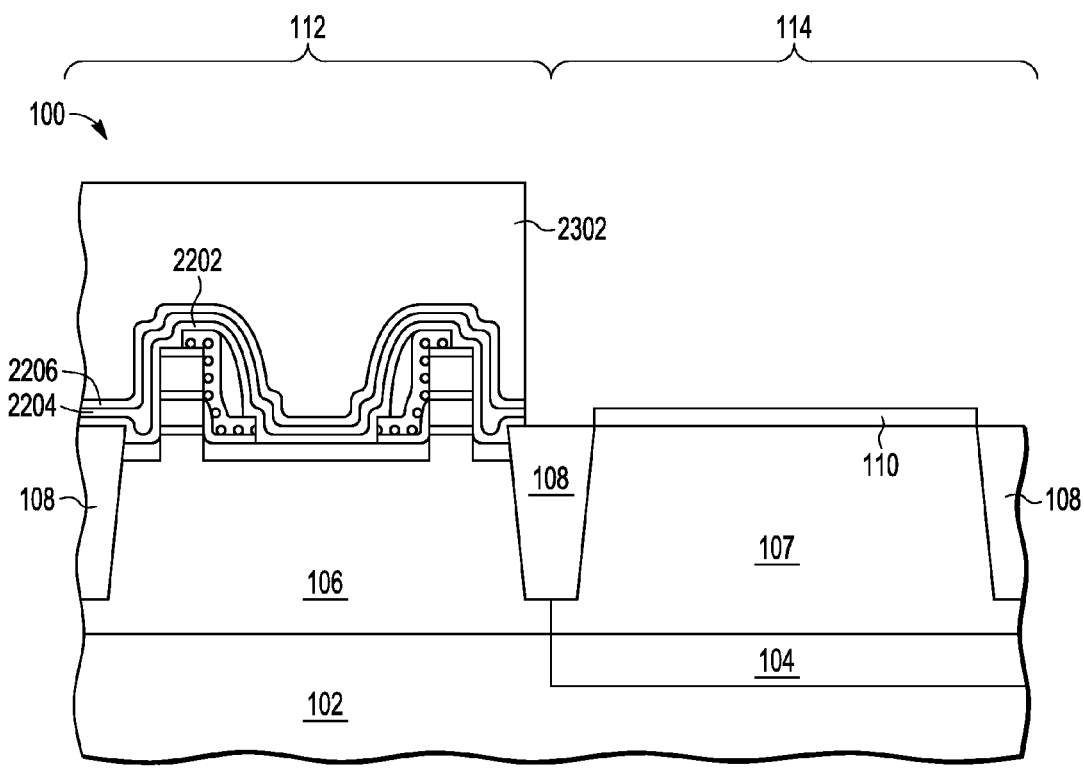

Shown in FIG. 23 is semiconductor structure 100 after photoresist 2302 is deposited over NVM region 112 and layers 2202-2206 and hard mask 806 are removed from logic region 114.

Figure 24:
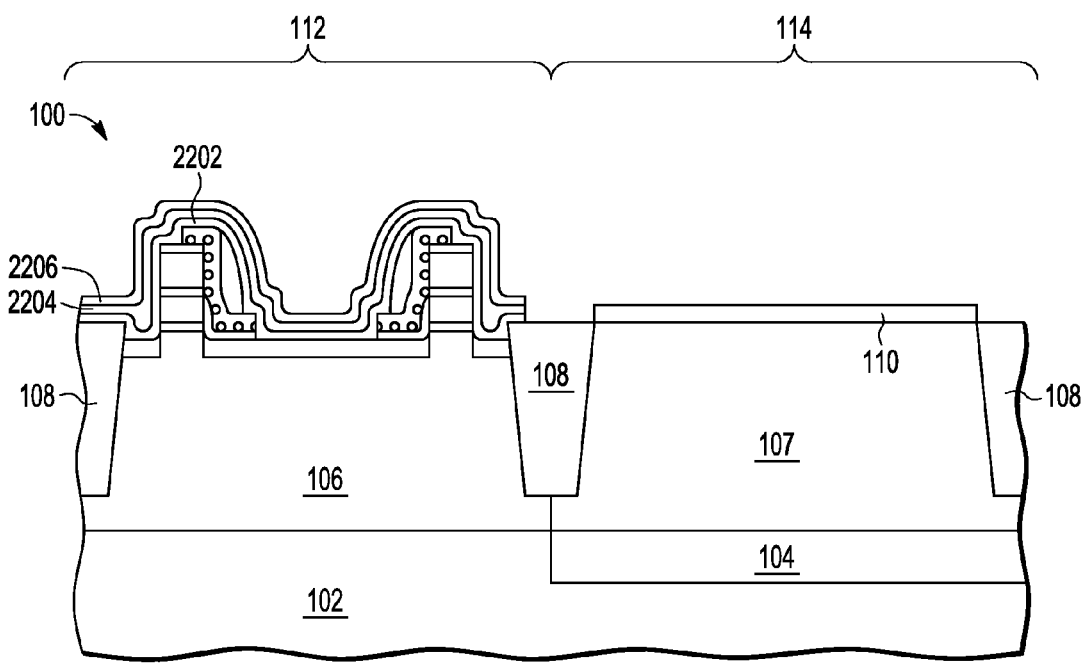

Shown in FIG. 24 is semiconductor structure 100 after photoresist 2302 is removed over NVM region 112.

Figure 25:
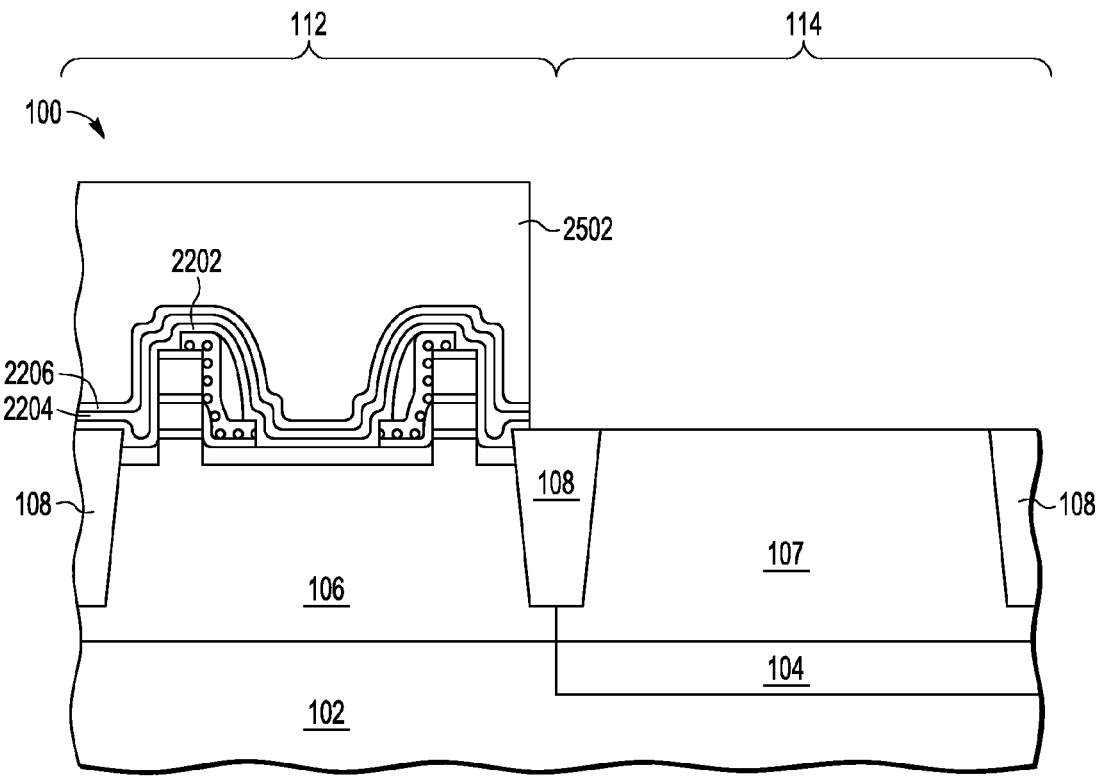

Shown in FIG. 25 is semiconductor structure 100 after photoresist 2502 is deposited over NVM region 112 and oxide layer 110 removed using wet etch or other suitable technique.

Figure 26:
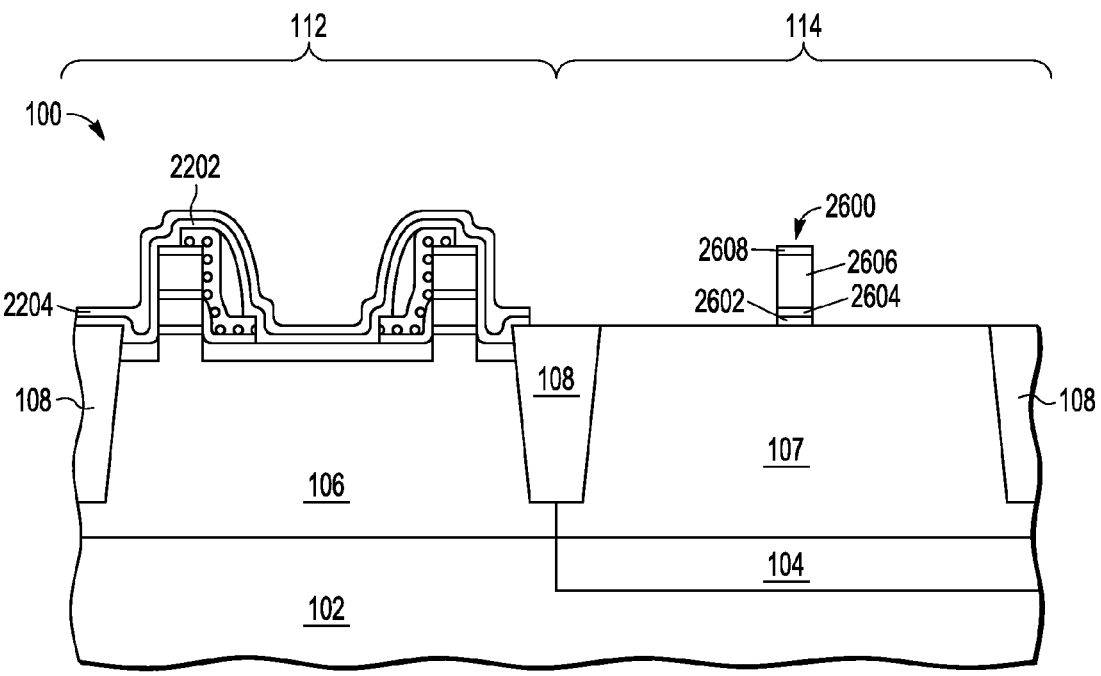

Shown in FIG. 26 is semiconductor structure 100 after high-k dielectric layer 2602, barrier metal layer 2604, and polysilicon layer 2606 are deposited, patterned and etched to form gate stack 2600 in logic region 114. In addition to protecting high-k dielectric layer 2602, barrier metal layer 2604 (also referred to as work function metal) can be configured to also set a work function for gate stack 2600. High-k dielectric layer 2602 can have a layer of base oxide 10 Angstroms or less in thickness under a high-k dielectric material with thickness of 15 to 30 Angstroms or other suitable thickness and be deposited using chemical vapor deposition (CVD) or other suitable technique. Barrier metal layer 1604 can be formed of a suitable material such as titanium nitride have a thickness ranging from 15 to 150 Angstroms or other suitable thickness and deposited using physical vapor deposition (PVD) (also known as "sputtering") or other suitable technique. Polysilicon layer 2606 can have a thickness of 400 to 800 Angstroms or other suitable thickness and be deposited using chemical vapor deposition (CVD) or other suitable technique. Oxide layer 2608 can have a thickness of 50 to 100 Angstroms or other suitable thickness and be deposited using CVD or other suitable technique. Photoresist 2502 and oxide layer 2206 are removed prior to deposition of layers 2602, 2604, 2606, 2608.

Figure 27:
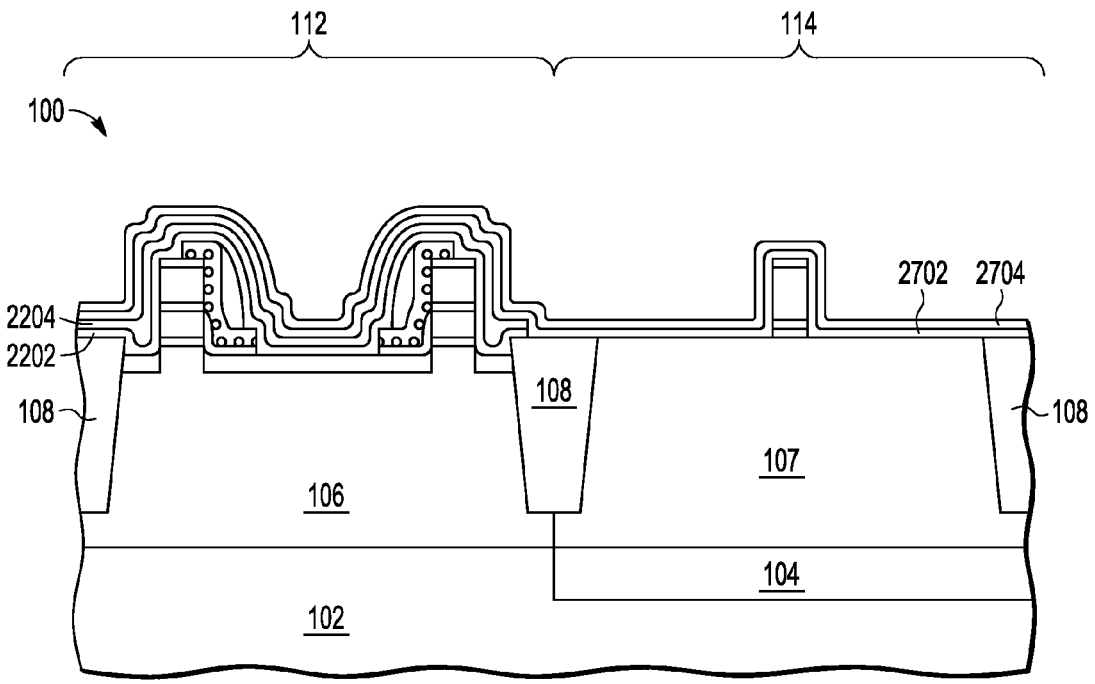

Shown in FIG. 27 is semiconductor structure 100 after one or more layers of spacer material such as nitride layer 2702 and oxide layer 2704 have been deposited. Nitride layer 2702 can have a thickness of 20 to 120 Angstroms or other suitable thickness and be deposited using CVD or other suitable technique. Oxide layer 2704 can have a thickness of 50 to 200 Angstroms or other suitable thickness and be deposited using CVD or other suitable technique.

Figure 28:
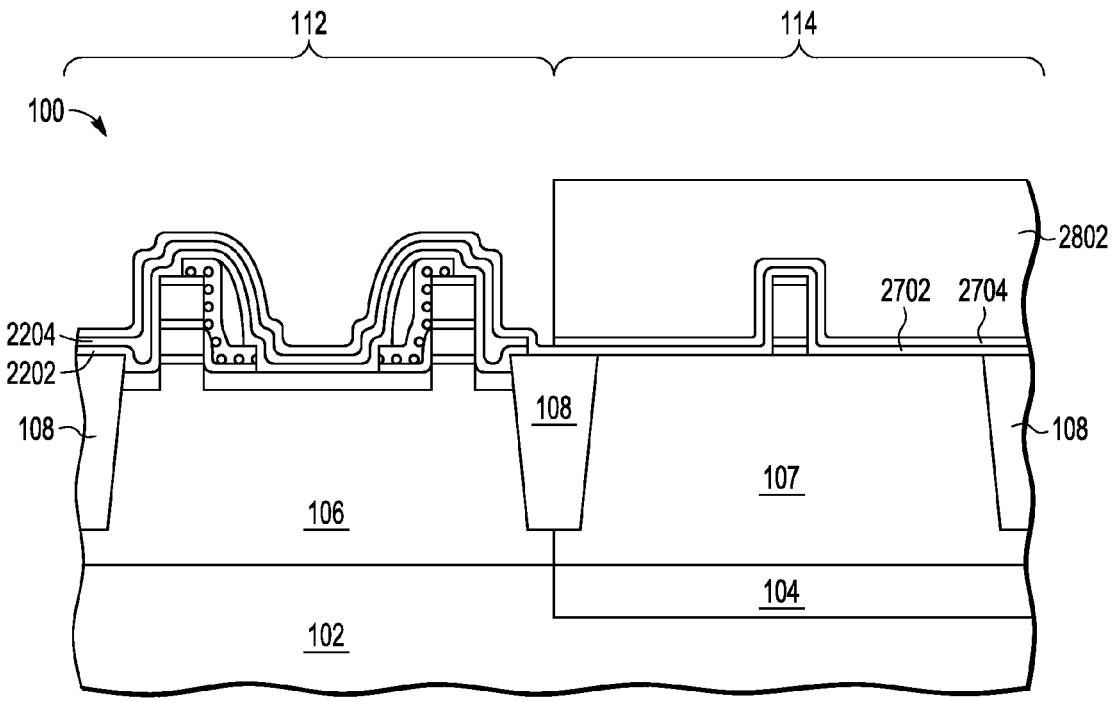

Shown in FIG. 28 is semiconductor structure 100 after photoresist 2802 has been deposited and oxide layer 2704 patterned using a wet etch or other suitable technique. After the photoresist 2802 is stripped, the logic region 114 is covered with nitride layer 2702 and oxide layer 2704 while the NVM region is covered with oxide layer 2202, nitride layer 2204, nitride layer 2702.

Figure 29:
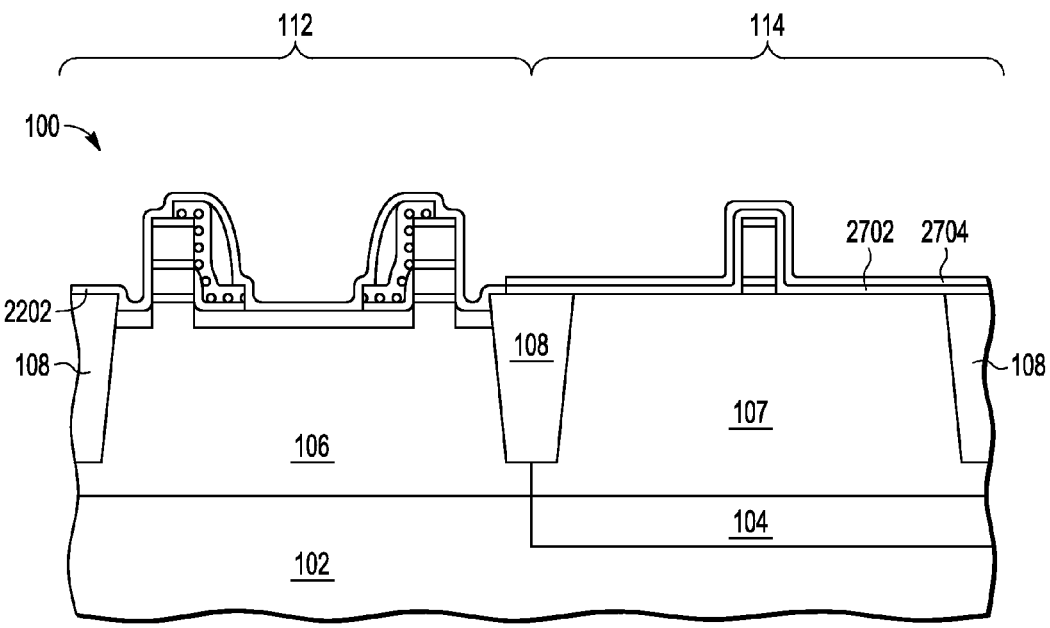

Shown in FIG. 29 is semiconductor structure 100 after wet etches are used to remove protective layers from NVM region 112 including nitride layers 2204 and oxide layer 2704 while oxide layer 2202 remains. Oxide layer 2704 remains in logic region 114.

Figure 30:
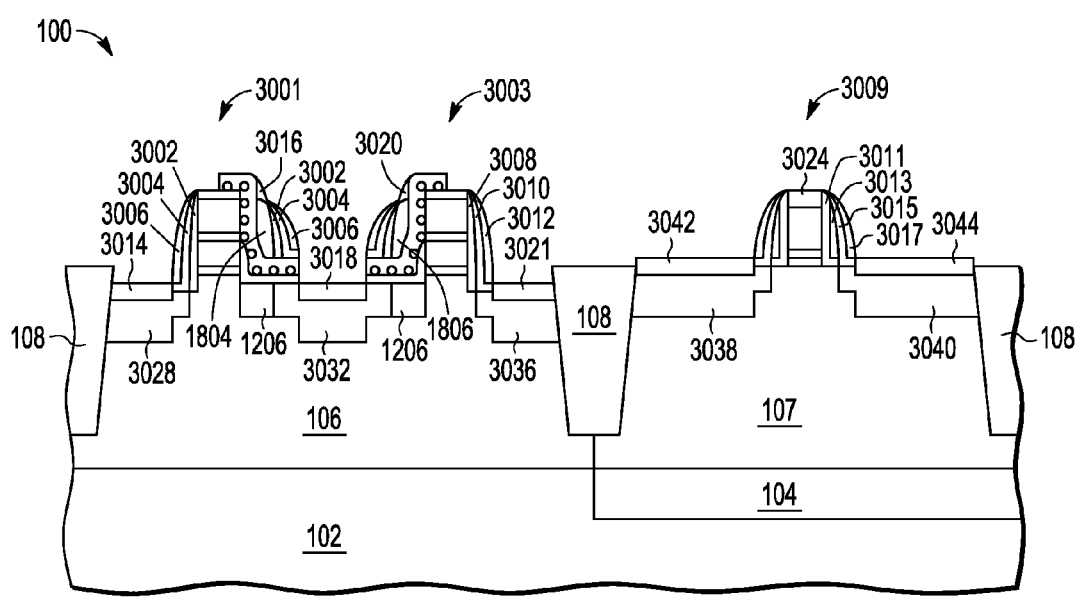

Shown in FIG. 30 is semiconductor structure 100 after oxide layer 2202 is etched to form spacers 3002, 3008 around respective NVM cells 3001, 3003, and after nitride layer 2702 and oxide layer 2704 are etched (in the same process step as the etch of layer 2202) to form liner 3011 and spacer 3013 around logic device 3009. An oxide layer followed by a nitride layer is subsequently deposited over regions 112, 114. The oxide and nitride layers are etched to form liners 3004, 3010 and sidewall spacers 3006, 3012 around respective NVM cells 3001, 3003, and liner 3015 and spacer 3017 around logic device 3009.

Spacers 3002, 3008, liners 3004, 3010, and spacers 3006, 3012 leave a top portion of control gate spacers 1804 and 1806 exposed adjacent charge storage layer 1502 (FIG. 15). The exposed portion of spacers 1804, 1806 and source/drain regions 3028-3040 are implanted with a doping material. Source/drain regions 3028-3040 are spaced from the gates of NVM cells 3001, 3003 and logic device 3009 due to respective spacers 3002, 3008 and 3013.

Source/drain regions 3028, 3032, 3036, 3038, 3040 and exposed portions of spacers 1804, 1806 can be silicided to make low resistance contacts 3014, 3016, 3018, 3020, 3021, 3042, 3044. The silicide can have a thickness ranging from 50 to 200 Angstroms or other suitable thickness and can be formed by sputtering metal and annealing device 100 to thermally form a silicon-metal compound.

Figure 31:
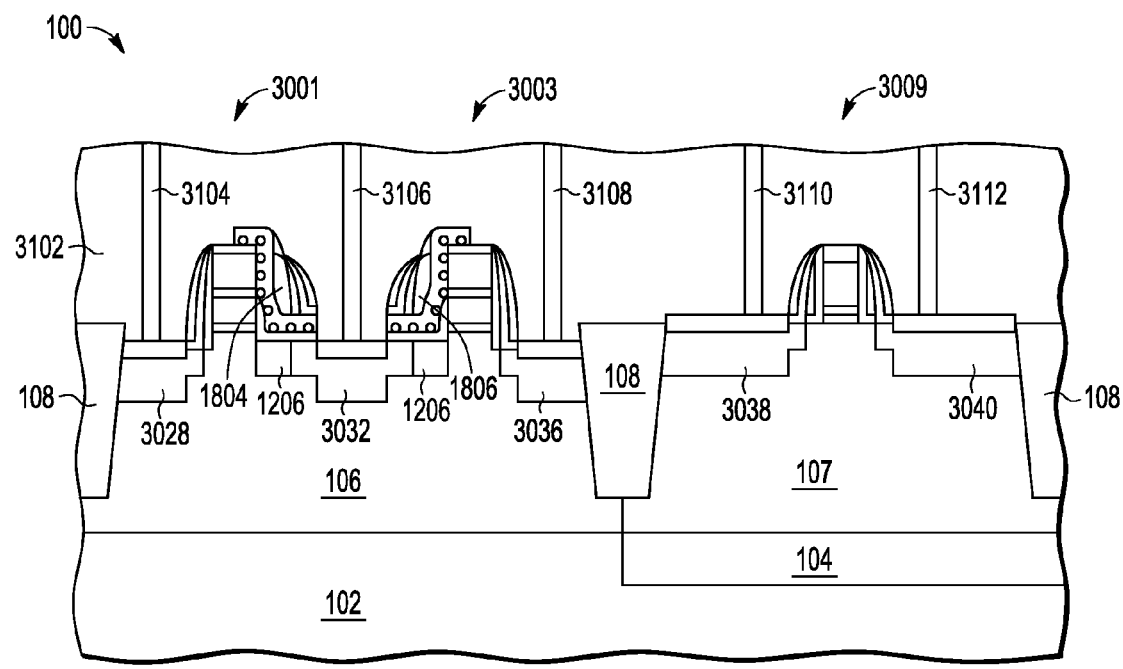

Shown in FIG. 31 is semiconductor structure 100 after insulating dielectric layer 3102 is deposited over NVM region 112 and logic region 114, and polished to a height ranging from 500 to 800 Angstroms or other suitable thickness, depending on the height of NVM cells 3001, 3003 and logic device 3009.

Shown in FIG. 31 is semiconductor structure 100 after interlayer dielectric 3102 is deposited over NVM region 112 and logic region 114. Openings 3104-3112 can be formed in dielectric layer 3102 and filled with conductive material to make contact with source/drain regions 3028-3040 of NVM cells 3001, 3003 and logic device 3009.

By now it should be appreciated that in one embodiment there has been provided a method of making a semiconductor structure using a substrate having a non-volatile memory (NVM) region (112) and a logic (114) region, comprising forming a select gate (804) over the substrate in the NVM region, and forming a charge storage layer (1502) over the substrate including over the logic region and the NVM region. Over the NVM region includes over the select gate. A conformal conductive layer (1602) is formed over the charge storage layer including over the logic region and the NVM region. Over the NVM region includes over the select gate. The conformal conductive layer is etched to form a control gate (1806) adjacent to a sidewall of the select gate. A (1904) mask is formed over the charge storage layer, the control gate, and a portion of the select gate. A patterned etch of the charge storage layer is performed using the mask to leave a portion of the charge storage layer over the select gate and under the control gate and to remove the charge storage layer from the logic region. A gate structure (2600) is formed in the logic region having a work function metal (2604, 2606) surrounded by an insulating layer (3010, 3012).

In another aspect, the method can further comprise forming a hard mask (2202, 2204, 2206) over the NVM region after performing the patterned etch of the charge storage layer and prior to forming the gate structure in the logic region. Forming the gate structure can comprise forming a high k dielectric (2602) over the logic region; and forming the work function metal (2604) over the high k dielectric.

In another aspect, forming the gate structure can further comprise forming a polysilicon layer (2606) over the work function metal, and patterning the polysilicon layer, the work function metal, and the high k dielectric.

In another aspect, the forming the hard mask can comprise forming a nitride layer (2204).

In another aspect, the forming the hard mask can further comprise forming a first oxide layer (2202) prior to forming the nitride layer and forming a second oxide layer (2206) over the nitride layer.

In another aspect, forming the insulating layer can comprise forming a first nitride layer (2702) after the patterning the polysilicon layer, the work function metal, and the high k dielectric, forming a first oxide layer (2704) on the first nitride layer, and etching the first nitride layer and the first oxide layer to form a first implant mask for the gate structure.

In another aspect, the method can further comprise performing an extension implant using the first implant mask.

In another aspect, the forming the insulating layer can further comprise forming a second oxide layer (3015) over the logic region including over the first implant mask, and forming a second nitride layer (3017) over the second oxide layer. The method can further comprise etching the second nitride layer and the second oxide layer to form a second implant mask, and performing a deep source/drain implant using the second implant mask for the gate structure.

In another aspect, the method can further comprise removing a portion of the hard mask prior, the first oxide layer, and the first nitride layer from the NVM region prior to forming the second nitride layer which leaves a first layer (2202) in the NVM region. The second nitride layer can be formed on the first layer in the NVM region. The second oxide layer can be formed on the second nitride layer in the NVM region. Etching the second nitride layer and the second oxide layer etches the first layer to form an NVM implant mask. The deep source/drain implant uses the NVM implant mask (3002, 3004, 3006, 3008, 3010, 3012) for the select gate and the control gate.

In another aspect, the step of forming the charge storage layer can comprise forming a layer comprising nanocrystals surrounded by an insulating material.

In another aspect, the method can further comprise forming a first layer of thermal oxide (400) on the substrate in the NVM region, wherein the forming the select gate is further characterized as being formed on the first layer of thermal oxide.

In another aspect, the method can further comprise removing a portion of the first layer of thermal oxide adjacent to the select gate, and forming a second layer of thermal oxide (1404) adjacent to the select gate prior to forming the conformal conductive layer. The charge storage layer can be formed on the second layer of thermal oxide.

In another aspect, the method can further comprise etching the substrate adjacent to the select gate prior to forming the second layer of thermal oxide.

In yet another embodiment, a method of making a semiconductor structure using a substrate having a non-volatile memory (NVM) region (112) and a logic region (114) can comprise forming a select gate (804) in the NVM region, forming a charge storage layer (1502) over the substrate in the NVM region, forming a control gate (1806) adjacent to a first side of the select gate, forming a first hard mask (2202, 2204, 2206) over the NVM region, forming a high k dielectric (2602) over the logic region after forming the first hard mask, forming a work function metal (2604) over the high k dielectric, forming a conductive layer over the work function metal, and patterning the conductive layer, the work function metal, and the high k dielectric to form a gate stack.

In another aspect, the method can further comprise forming a second hard mask (2702, 2704) over the NVM region and the logic region, removing the second hard mask and a portion of the first hard mask from the NVM region, performing an etch to result in a first sidewall spacer (3011,3013) around the gate stack and a second sidewall spacer (3002, 3008) around the select gate and control gate, and performing an implant using the first sidewall spacer and the second sidewall spacer as masks.

In another aspect, the method can further comprise patterning the charge storage layer to remove a first portion of the charge storage layer from over the select gate and leave a second portion over the select gate.

In another aspect, the forming the charge storage layer can be further characterized as forming a nanocrystal layer.

In another aspect, the method can further comprise performing a first thermal oxidation (400) on the substrate prior to forming the select gate, removing oxide from the substrate prior after forming the select gate, and performing a second thermal oxidation (1404) prior to forming the control gate. The control gate can be formed on oxide formed by the second thermal oxidation.

In another aspect, forming the first hard mask layer can comprise forming a first oxide layer (2202), forming a nitride layer (2204) over the first oxide layer, and forming a second oxide layer (2206) over the nitride layer.

In another embodiment, a semiconductor structure using a substrate having a non-volatile memory (NVM) portion (112) and a logic region (114) can comprise a select gate (804) comprising polysilicon over a thermal oxide layer (400) on the substrate in the NVM region, a control gate (1806) adjacent only to a first side of the select gate, and a first sidewall spacer (3010, 3012) extending around the select gate and the control gate. The first sidewall spacer can comprise a first portion of a first insulating layer. A charge storage layer (1502) can have a first portion between the control gate and the substrate, a second portion between the control gate and the first side of the select gate, and a third portion over a portion of the select gate. A gate structure (3009) can comprise a high k dielectric (2602) over the substrate in the logic region and a work function metal (2604) over the high k dielectric, and a second sidewall spacer (3015, 3017) can extend around the gate structure. The second sidewall spacer can comprise a second portion of the first insulating layer.

Although the disclosure has been described with respect to specific conductivity types or polarity of potentials, skilled artisans appreciated that conductivity types and polarities of potentials may be reversed.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, a top oxide and a bottom oxide were described but another insulating material may be substituted. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor structure using a substrate having a non-volatile memory (NVM) region and a logic region, comprising:
    forming a select gate over the substrate in the NVM region;
    forming a charge storage layer over the substrate including over the logic region and the NVM region, wherein over the NVM region includes over the select gate;
    forming a conformal conductive layer over the charge storage layer including over the logic region and the NVM region, wherein over the NVM region includes over the select gate;
    etching the conformal conductive layer to form a control gate adjacent to a sidewall of the select gate;
    forming a mask over a portion of the charge storage layer, the control gate, and a portion of the select gate; and
    performing a patterned etch of the charge storage layer using the mask to leave the portion of the charge storage layer over the select gate and under the control gate and to remove the charge storage layer from the logic region;
    forming a gate structure in the logic region having a work function metal surrounded by an insulating layer.

2. The method of claim 1, further comprising:
    forming a hard mask over the NVM region after performing the patterned etch of the charge storage layer and prior to forming the gate structure in the logic region;
    wherein the forming the gate structure comprises:
    forming a high k dielectric over the logic region; and
    forming the work function metal over the high k dielectric.

3. The method of claim 2, wherein the forming the gate structure further comprises forming a polysilicon layer over the work function metal; and
    patterning the polysilicon layer, the work function metal, and the high k dielectric.

4. The method of claim 2, wherein the forming the hard mask comprises forming a nitride layer.

5. The method of claim 4, wherein the forming the hard mask further comprises forming a first oxide layer prior to forming the nitride layer and forming a second oxide layer over the nitride layer.

6. The method of claim 3, wherein forming the insulating layer comprises:
   forming a first nitride layer after the patterning the polysilicon layer, the work function metal, and the high k dielectric;
   forming a first oxide layer on the first nitride layer; and
   etching the first nitride layer and the first oxide layer using an anisotropic etch to form a first implant mask for the gate structure.

7. The method of claim 6, further comprising performing an extension implant using the first implant mask.

8. The method of claim 7, wherein the forming the insulating layer further comprises:
   forming a second oxide layer over the logic region including over the first implant mask;
   forming a second nitride layer over the second oxide layer;
   wherein the method further comprises etching the second nitride layer and the second oxide layer to form a second implant mask; and
   performing a deep source/drain implant using the second implant mask for the gate structure.

9. The method of claim 8, further comprising removing a portion of the hard mask prior, the first oxide layer, and the first nitride layer from the NVM region prior to forming the second nitride layer which leaves a first layer in the NVM region, wherein:
   the second nitride layer is formed on the first layer in the NVM region;
   the second oxide layer is formed on the second nitride layer in the NVM region;
   the etching the second nitride layer and the second oxide layer etches the first layer to form an NVM implant mask; and
   the deep source/drain implant uses the NVM implant mask for the select gate and the control gate.

10. The method of claim 1, wherein the step of forming the charge storage layer comprises forming a layer comprising nanocrystals surrounded by an insulating material.

11. The method of claim 1, further comprising forming a first layer of thermal oxide on the substrate in the NVM region, wherein the forming the select gate is further characterized as being formed on the first layer of thermal oxide.

12. The method of claim 11, further comprising:
   removing a portion of the first layer of thermal oxide adjacent to the select gate; and
   forming a second layer of thermal oxide adjacent to the select gate prior to forming the conformal conductive layer,
   wherein the charge storage layer is formed on the second layer of thermal oxide.

13. The method of claim 12, further comprising etching the substrate adjacent to the select gate prior to forming the second layer of thermal oxide.

14. A method of making a semiconductor structure using a substrate having a non-volatile memory (NVM) region and a logic region, comprising:
   forming a select gate in the NVM region;
   forming a charge storage layer over the substrate in the NVM region;
   forming a control gate adjacent to a first side of the select gate;
   forming a first hard mask over the NVM region;
   forming a high k dielectric over the logic region after forming the first hard mask;
   forming a work function metal over the high k dielectric;
   forming a conductive layer over the work function metal; and
   patterning the conductive layer, the work function metal, and the high k dielectric to form a gate stack.

15. The method of claim 14, further comprising:
   forming a second hard mask over the NVM region and the logic region;
   removing the second hard mask and a portion of the first hard mask from the NVM region;
   performing an etch to result in a first sidewall spacer around the gate stack and a second sidewall spacer around the select gate and control gate; and
   performing an implant using the first sidewall spacer and the second sidewall spacer as masks.

16. The method of claim 14, further comprising patterning the charge storage layer to remove a first portion of the charge storage layer from over the select gate and leave a second portion over the select gate.

17. The method of claim 16, wherein the forming the charge storage layer is further characterized as forming a nanocrystal layer.

18. The method of claim 17, further comprising:
   performing a first thermal oxidation on the substrate prior to forming the select gate;
   removing oxide from the substrate prior after forming the select gate; and
   performing a second thermal oxidation prior to forming the control gate;
   wherein the control gate is formed on oxide formed by the second thermal oxidation.

19. The method of claim 18 wherein the forming the first hard mask layer comprises:
   forming a first oxide layer;
   forming a nitride layer over the first oxide layer; and
   forming a second oxide layer over the nitride layer.

* * * * *